US010832556B2

(12) United States Patent
Lee et al.

(10) Patent No.: US 10,832,556 B2
(45) Date of Patent: Nov. 10, 2020

(54) METHOD FOR DETERMINING BATTERY STATE ON BASIS OF ATMOSPHERIC PRESSURE AND ELECTRONIC DEVICE

(71) Applicant: SAMSUNG ELECTRONICS CO., LTD., Suwon-si (KR)

(72) Inventors: Jungwoo Lee, Seongnam-si (KR); Changki Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/491,357

(22) PCT Filed: Feb. 8, 2018

(86) PCT No.: PCT/KR2018/001715
§ 371 (c)(1),
(2) Date: Sep. 5, 2019

(87) PCT Pub. No.: WO2018/164381
PCT Pub. Date: Sep. 13, 2018

(65) Prior Publication Data
US 2020/0035082 A1 Jan. 30, 2020

(30) Foreign Application Priority Data
Mar. 10, 2017 (KR) .......................... 10-2017-0030836

(51) Int. Cl.
*G08B 21/18* (2006.01)
*G01R 31/382* (2019.01)
(Continued)

(52) U.S. Cl.
CPC .......... *G08B 21/182* (2013.01); *G01B 13/24* (2013.01); *G01R 31/382* (2019.01); *G08B 5/22* (2013.01);
(Continued)

(58) Field of Classification Search
CPC combination set(s) only.
See application file for complete search history.

(56) References Cited

U.S. PATENT DOCUMENTS 5,290,640 A 3/1994 Tsenter et al.
6,602,633 B1* 8/2003 Ohbayashi .......... H01M 2/1235
200/61.08
(Continued)

FOREIGN PATENT DOCUMENTS

JP 2011-009042 1/2011
JP 2013-065515 4/2013
(Continued)

OTHER PUBLICATIONS

International Search Report for PCT/KR2018/001715, dated May 25, 2018, 5 pages.
(Continued)

*Primary Examiner* — An T Nguyen
(74) *Attorney, Agent, or Firm* — Nixon & Venderhye, P.C.

(57) ABSTRACT

Various embodiments of the present invention relate to a method for detecting a battery state (for example, swollen state) at least partially on the basis of atmospheric pressure, a battery, or an electronic device comprising the battery. According to one embodiment, the electronic device comprises: at least one sensor; a housing; a battery disposed inside the housing and including an atmospheric pressure sensor; and a processor, wherein the processor can be configured to detect an internal atmospheric pressure of the battery by using the atmospheric pressure sensor, to check state information related to the electronic device by using the at least one sensor, and to perform a designated function when the atmospheric pressure satisfies a designated condi-
(Continued)

tion at least on the basis of the state information. In addition, various embodiments are possible.

11 Claims, 13 Drawing Sheets

(51) Int. Cl.
    *G01B 13/24* (2006.01)
    *G08B 5/22* (2006.01)
    *H01M 10/44* (2006.01)
    *H01M 10/48* (2006.01)
    *H02J 7/00* (2006.01)

(52) U.S. Cl.
    CPC ......... *H01M 10/44* (2013.01); *H01M 10/486* (2013.01); *H02J 7/007* (2013.01)

(56) References Cited

U.S. PATENT DOCUMENTS

| | | | | |
|---|---|---|---|---|
| 9,356,325 | B1* | 5/2016 | Poirier | H01M 10/486 |
| 9,917,335 | B2* | 3/2018 | Jarvis | H01M 10/4257 |
| 10,355,319 | B1* | 7/2019 | Lim | H01M 10/049 |
| 2006/0076926 | A1* | 4/2006 | Lee | H02J 7/0047 |
| | | | | 320/112 |
| 2008/0097704 | A1* | 4/2008 | Notten | H01M 10/445 |
| | | | | 702/42 |
| 2010/0068607 | A1* | 3/2010 | Spare | H01M 10/48 |
| | | | | 429/90 |
| 2010/0201320 | A1* | 8/2010 | Coe | H02J 7/007 |
| | | | | 320/129 |
| 2012/0208054 | A1* | 8/2012 | Shirasawa | H01M 10/0481 |
| | | | | 429/90 |
| 2013/0093383 | A1* | 4/2013 | Kim | H02J 7/00719 |
| | | | | 320/107 |
| 2014/0342193 | A1* | 11/2014 | Mull | H01M 10/4257 |
| | | | | 429/50 |
| 2016/0064780 | A1* | 3/2016 | Jarvis | H01M 10/48 |
| | | | | 429/50 |
| 2016/0268644 | A1* | 9/2016 | Lee | H01M 10/48 |
| 2017/0047621 | A1* | 2/2017 | Fukuda | G01L 9/14 |
| 2017/0263915 | A1* | 9/2017 | Umeyama | H01M 2/34 |
| 2017/0299659 | A1* | 10/2017 | Fukuda | G01B 7/24 |
| 2017/0302090 | A1* | 10/2017 | Han | H01M 10/42 |
| 2018/0040926 | A1* | 2/2018 | Keser | H01M 10/425 |
| 2018/0159183 | A1* | 6/2018 | Jarvis | H01M 10/48 |
| 2018/0261824 | A1* | 9/2018 | Ju | H02J 7/0047 |
| 2018/0316067 | A1* | 11/2018 | Schwarzberger | H01M 10/48 |
| 2020/0035082 | A1* | 1/2020 | Lee | G01R 31/392 |

FOREIGN PATENT DOCUMENTS

| | | |
|---|---|---|
| KR | 10-1996-0701490 | 2/1996 |
| KR | 10-2001-0061301 | 7/2001 |
| KR | 10-2014-0017386 | 2/2014 |
| KR | 10-2014-0087425 | 7/2014 |
| KR | 10-1685102 | 12/2016 |

OTHER PUBLICATIONS

Written Opinion of the ISA for PCT/KR2018/001715, dated May 25, 2018, 7 pages.

* cited by examiner

METHOD FOR DETERMINING BATTERY STATE ON BASIS OF ATMOSPHERIC PRESSURE AND ELECTRONIC DEVICE

This application is the U.S. national phase of International Application No. PCT/KR2018/001715 filed 8 Feb. 2018, which designated the U.S. and claims priority to KR Patent Application No. 10-2017-0030836 filed 10 Mar. 2017, the entire contents of each of which are hereby incorporated by reference.

TECHNICAL FIELD

Various embodiments of the disclosure relate to a method or electronic device for sensing a state of a battery.

BACKGROUND ART

Batteries are categorized by materials used as the positive electrode, negative electrode, or electrolyte, into the nickel-cadmium battery, the nickel-metal hydride battery, the lithium ion battery, the lithium polymer battery, etc., and are also categorized by shape into a cylindrical type, a prismatic type, a pouch type, etc.

As demand has recently grown for portable electronic devices, demand for batteries is also growing. Among the batteries, the lithium ion battery is widely used due to the advantages such as high energy density, high discharge voltage, and output stability.

The lithium ion battery includes a negative electrode plate to which a negative electrode active material is applied, a positive electrode plate to which a positive electrode active material is applied, and a separator disposed between the negative electrode plate and the positive electrode plate. A lithium oxide is used as the positive electrode active material, and a carbon material is used as the negative electrode active material.

DISCLOSURE OF INVENTION

Technical Problem

One of the main research subjects in the field of battery is to improve safety. With respect to the lithium ion battery generally used in various portable electronic devices, an occurrence in which a battery pack swells (i.e. battery swelling) may happen due to damage inflicted by an internal short circuit, a state of being charged beyond an allowable current or voltage limit, exposure to high temperature, dropping, or a drastic change in the external atmospheric pressure, etc. Since the battery swelling can cause the battery pack to burn, explode, etc., it may be required to devise a measure to prevent a safety accident.

Various embodiments of the disclosure can provide a method or electronic device which can sense battery swelling in advance so as to prevent a safety accident due to the burning, explosion, etc. of a battery pack.

Solution to Problem

An electronic device according to various embodiments of the disclosure may include: at least one sensor; a housing; a battery disposed in the housing and including a barometer sensor; and a processor, wherein the processor is configured to sense the internal atmospheric pressure inside the battery by using the barometer sensor, obtain status information related to the electronic device by using the at least one sensor, determine at least in part on the basis of the status information that the internal atmospheric pressure has satisfied a specified condition, and perform a predetermined function at least in part on the basis of the determination.

A battery according to various embodiments of the disclosure may include: a battery housing configured to receive a battery cell; a connector formed on the battery housing; a barometer sensor disposed in the battery housing and configured to sense the internal atmospheric pressure inside the battery housing; and a detection circuit, wherein the detection circuit is configured to determine a state of the battery cell at least in part on the basis of the internal atmospheric pressure, and deliver a signal, corresponding to the state of the battery cell, to the electronic device connected through the connector.

A method for operating an electronic device including a battery according to various embodiments of the disclosure may include the operations of: sensing the internal atmospheric pressure inside the battery by using a barometer sensor included in the battery; obtaining status information related to the electronic device by using at least one sensor of the electronic device; determining that the internal atmospheric pressure satisfies a specified condition, at least in part on the basis of the status information by using the processor of the electronic device; and performing a predetermined function at least in part on the basis of the determination by using the processor.

Advantageous Effects of Invention

Various embodiments of the disclosure can sense battery swelling in advance to prevent a safety accident due to the burning, explosion, etc. of a battery pack.

Various embodiments of the disclosure can sense swelling of a battery in advance and then limit a function related to charging of the battery beforehand, thereby requiring no heat shield which is to protect the components of an electronic device from heat generated from a battery pack, and thus it is possible to reduce the manufacturing costs.

MODE FOR THE INVENTION

Figure 1:
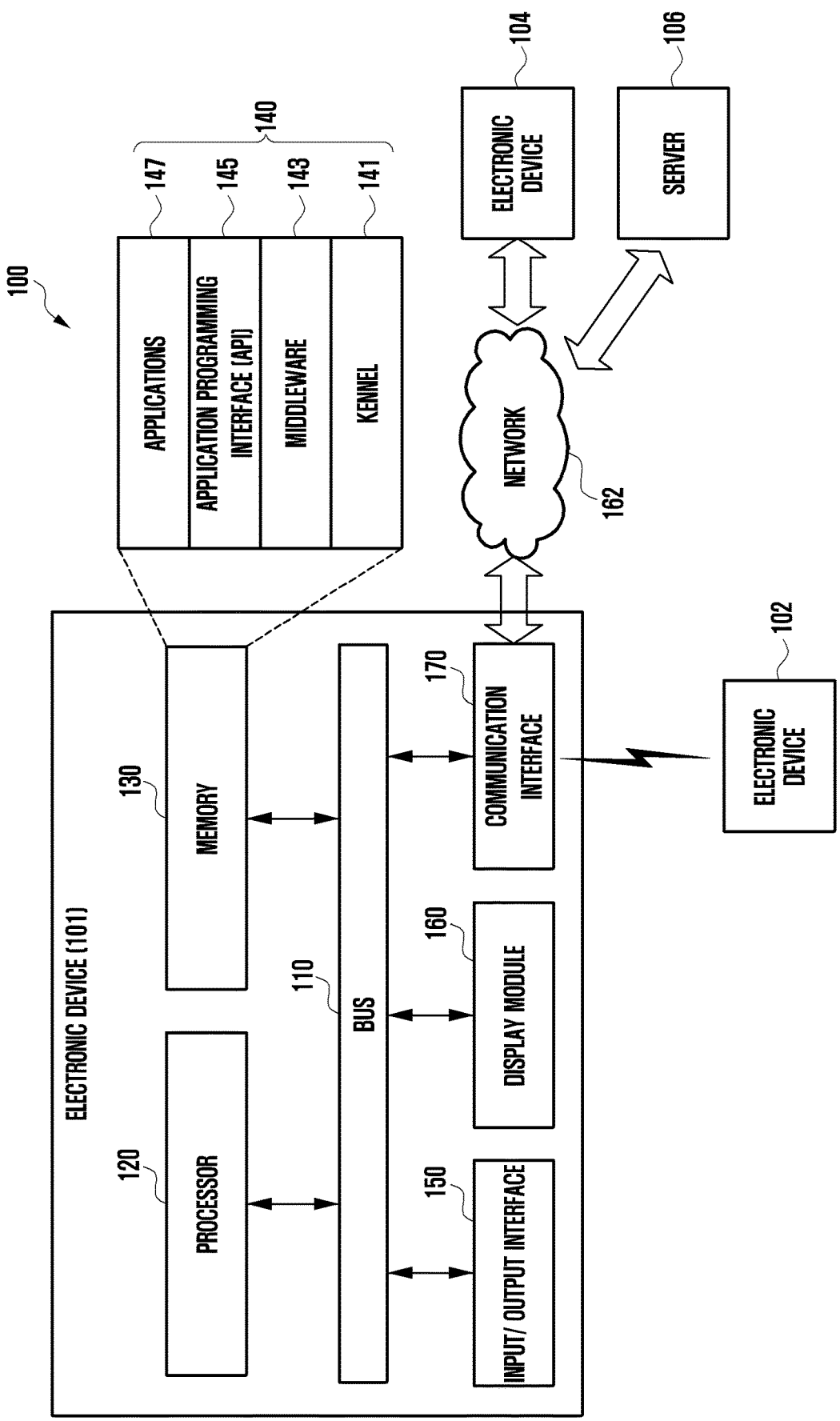
FIG. 1 is a block diagram illustrating an electronic device within a network environment according to various embodiments.

Hereinafter, various embodiments will be described with reference to the accompanying drawings. The embodiments and the terms used therein are not intended to limit the technology disclosed herein to specific forms, and should be understood to include various modifications, equivalents, and/or alternatives of the corresponding embodiments. In describing the drawings, similar reference numerals may be used to designate similar constituent elements. A singular expression may include a plural expression unless they are definitely different in a context. As used herein, the expression "A or B" or "at least one of A and/or B" may include all possible combinations of items enumerated together. The expression "a first", "a second", "the first", or "the second" may modify various elements regardless of the order and/or the importance, and is used merely to distinguish one element from another element without limiting the corresponding elements. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments may be interchangeably used with, for example, "suitable for", "having the capacity to", "adapted to", "made to", "capable of", or "designed to" in terms of hardware or software, according to circumstances. Alternatively, in some situations, the expression "device configured to" may mean that the device, together with other devices or components, "is able to". For example, the phrase "processor adapted (or configured) to perform A, B, or C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

An electronic device according to various embodiments may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, or a wearable device. The wearable device may include at least one of an accessory type (e.g., a watch, a ring, a bracelet, an anklet, a necklace, glasses, a contact lens, or a head-mounted device (HMD)), a fabric or clothing integrated type (e.g., an electronic clothing), a body-mounted type (e.g., a skin pad, or tattoo), or a bio-implantable type (e.g., an implantable circuit). In some embodiments, the electronic device may include at least one of, for example, a television, a digital video disk (DVD) player, an audio, a refrigerator, an air conditioner, a cleaner, an oven, a microwave oven, a washing machine, an air cleaner, a set-top box, a home automation control panel, a security control panel, a media box (e.g., Samsung HomeSync™, Apple TV™, or Google TV™), a game console (e.g., Xbox™ and PlayStation™), an electronic dictionary, an electronic key, a camcorder, or an electronic photo frame.

In other embodiments, the electronic device may include at least one of various medical devices (e.g., various portable medical measuring devices (a blood sugar measuring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting tool, a hot water tank, a heater, a boiler, etc.). According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). In various embodiments, the electronic device may be flexible, or may be a combination of one or more of the aforementioned various devices. According to an embodiment, the electronic devices are not limited to those described above. In the disclosure, the term "user" may indicate a person using an electronic device or a device (e.g., an artificial intelligence electronic device) using an electronic device.

Referring to FIG. 1, an electronic device 101 within a network environment 100 according to various embodiments will be described. The electronic device 101 may include a bus 110, a processor 120, a memory 130, an input/output interface 150, a display 160, and a communication interface 170. In some embodiments, the electronic device 101 may omit at least one of the elements, or may further include another element. The bus 110 may include, for example, a circuit that interconnects the elements 110 to 170 and enables communication (for example, transmission of control messages or data) between the elements. The processor 120 may include one or more of a central processing unit, an application processor, and a communication processor (CP). The processor 120, for example, may carry out operations or data processing relating to the control and/or communication of at least one other element of the electronic device 101.

The memory 130 may include a volatile and/or non-volatile memory. The memory 130 may store, for example, instructions or data relating to at least one other element of the electronic device 101. According to an embodiment, the memory 130 may store software and/or a program 140. The program 140 may include a kernel 141, middleware 143, an application programming interface (API) 145, and/or application programs (or "applications") 147. At least some of the kernel 141, the middleware 143, and the API 145 may be referred to as an operating system. The kernel 141 may control or manage system resources (for example, the bus 110, the processor 120, or the memory 130) used for executing an operation or function implemented by other programs (for example, the middleware 143, the API 145, or the application 147). Furthermore, the kernel 141 may provide an interface through which the middleware 143, the API 145, or the application programs 147 can access the individual elements of the electronic device 101 to control or manage the system resources.

The middleware 143 may function as, for example, an intermediary for allowing the API 145 or the application programs 147 to communicate with the kernel 141 to exchange data. Furthermore, the middleware 143 may process one or more task requests, which are received from the application programs 147, according to priorities thereof. For example, the middleware 143 may assign priorities for using the system resources (for example, the bus 110, the processor 120, the memory 130, or the like) of the electronic device 101 to one or more of the application programs 147, and may process the one or more task requests. The API 145 is an interface through which the applications 147 control functions provided from the kernel 141 or the middleware 143, and may include, for example, at least one interface or function (for example, instruction) for file control, window control, image processing, or text control. For example, the input/output interface 150 may forward instructions or data, input from a user or an external device, to the other element(s) of the electronic device 101, or may output instructions or data, received from the other element(s) of the electronic device 101, to the user or an external device.

The display 160 may include, for example, a liquid crystal display (LCD), a light emitting diode (LED) display, an organic light emitting diode (OLED) display, a micro electro mechanical system (MEMS) display, or an electronic paper display. The display 160 may display, for example, various types of contents (e.g., text, images, videos, icons, or symbols) to the user. The display 160 may include a touch screen and may receive, for example, a touch, gesture, proximity, or hovering input using an electronic pen or the user's body part. The communication interface 170 may establish, for example, communication between the electronic device 101 and an external device (for example, a first external electronic device 102, a second external electronic device 104, or a server 106). For example, the communication interface 170 may be connected to a network 162 through wireless or wired communication to communicate with an external device (for example, the second external electronic device 104 or the server 106).

The wireless communication may include, for example, a cellular communication that uses at least one of LTE, LTE-Advanced (LTE-A), code division multiple access (CDMA), wideband CDMA (WCDMA), universal mobile telecommunications system (UMTS), wireless broadband (WiBro), global system for mobile communications (GSM), or the like. According to one embodiment, the wireless communication may include a short-range communication 164. For example, as indicated by reference numeral 164 in FIG. 1, the short-range communication 164 may include at least one of wireless fidelity (WiFi), light fidelity (LiFi), Bluetooth, bluetooth low energy (BLE), Zigbee, near field communication (NFC), magnetic secure transmission, radio frequency (RF), or body area network (BAN). According to an embodiment, the wireless communication may include, for example, at least one of wireless fidelity (WiFi), light fidelity (LiFi), Bluetooth, bluetooth low energy (BLE), Zigbee, near field communication (NFC), magnetic secure transmission, radio frequency (RF), or body area network (BAN). According to an embodiment, the wireless communication may include a global navigation satellite system (GNSS). The GNSS may be, for example, a global positioning system (GPS), a global navigation satellite system (GNSS), a Beidou navigation satellite system (hereinafter, referred to as "Beidou"), or Galileo (the European global satellite-based navigation system). Hereinafter, in this disclosure, the term "GPS" may be interchangeable with the term "GNSS". The wired communication may include, for example, at least one of a universal serial bus (USB), a high definition multimedia interface (HDMI), recommended standard 232 (RS-232), power line communication, or a plain old telephone service (POTS). The network 162 may include a telecommunications network, for example, at least one of a computer network (for example, a LAN or a WAN), the Internet, and a telephone network.

Each of the first and second external electronic devices 102 and 104 may be of the same as or a different type from the electronic device 101. According to various embodiments, all or some of the operations executed in the electronic device 101 may be executed in another electronic device or a plurality of other electronic devices (for example, the electronic devices 102 and 104 or the server 106). According to an embodiment, when the electronic device 101 has to perform some functions or services automatically or in response to a request, the electronic device 101 may make a request for performing at least some functions relating thereto to another device (for example, the electronic device 102 or 104 or the server 106) instead of performing the functions or services by itself or in addition. Another electronic device (for example, the electronic device 102 or 104, or the server 106) may execute the requested functions or the additional functions, and may deliver a result thereof to the electronic device 101. The electronic device 101 may provide the received result as it is, or may additionally process the received result to provide the requested functions or services. To this end, for example, cloud computing, distributed computing, or client-server computing technology may be used.

Figure 2:
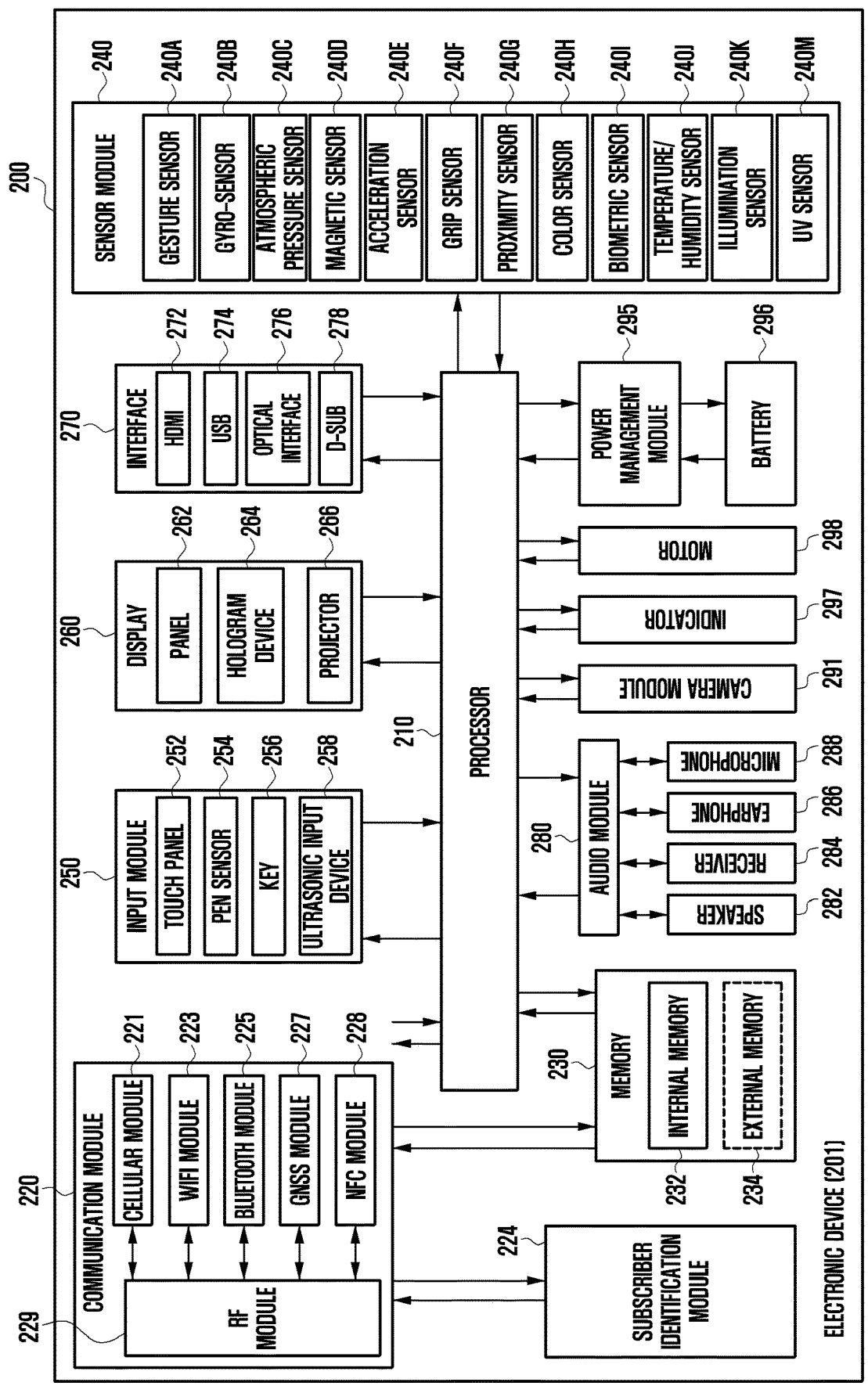
FIG. 2 is a block diagram of an electronic device according to various embodiments.

FIG. 2 is a block diagram of an electronic device 201 according to various embodiments. The electronic device 201 may include, for example, the whole or part of the electronic device 101 illustrated in FIG. 1. The electronic device 201 may include at least one processor 210 (for example, an AP), a communication module 220, a subscriber identification module 224, a memory 230, a sensor module 240, an input device 250, a display 260, an interface 270, an audio module 280, a camera module 291, a power management module 295, a battery 296, an indicator 297, and a motor 298. The processor 210 may control a plurality of hardware or software elements connected to the processor 210 and perform various data processing and operations by driving an operating system or an application program. The processor 210 may be implemented by, for example, a system on chip (SoC). According to an embodiment, the processor 210 may further include a graphic processing unit (GPU) and/or an image signal processor. The processor 210 may also include at least some of the elements illustrated in FIG. 2 (for example, a cellular module 221). The processor 210 may load, in volatile memory, instructions or data received from at least one of the other elements (for example, non-volatile memory), process the loaded instructions or data, and store the resultant data in the non-volatile memory.

The communication module 220 may have a configuration that is the same as, or similar to, that of the communication interface 170. The communication module 220 may include, for example, a cellular module 221, a Wi-Fi module 223, a Bluetooth module 225, a GNSS module 227, an NFC module 228, and an RF module 229. The cellular module 221 may provide, for example, a voice communication service, a video communication service, a text message service, an Internet service, or the like through a communication network. According to an embodiment, the cellular module 221 may identify and authenticate the electronic device 201 within a communication network using the subscriber identification module 224 (for example, a SIM card). According to an embodiment, the cellular module 221 may perform at least some of the functions that the processor 210 can provide. According to an embodiment, the cellular module 221 may include a communication processor (CP). In some embodiments, at least some (two or more) of the cellular module 221, the Wi-Fi module 223, the Bluetooth module 225, the GNSS module 227, or the NFC module 228 may be included in a single integrated chip (IC) or IC package. The RF module 229 may transmit or receive, for example, a communication signal (for example, an RF signal). The RF module 229 may include, for example, a transceiver, a power amplifier module (PAM), a frequency filter, a low noise amplifier (LNA), an antenna, or the like. According to another embodiment, at least one of the cellular module 221, the Wi-Fi module 223, the Bluetooth module 225, the GNSS module 227, and the NFC module 228 may transmit/receive an RF signal through a separate RF module. The subscriber identification module 224 may include, for example, a card that includes a subscriber identity module and/or an embedded SIM, and may contain unique identification information (for example, an integrated circuit card identifier (ICCID)) or subscriber information (for example, an international mobile subscriber identity (IMSI)).

The memory 230 (for example, the memory 130) may include, for example, an internal memory 232 or an external memory 234. The internal memory 232 may include, for example, at least one of a volatile memory (for example, a DRAM, an SRAM, an SDRAM, or the like) and a nonvolatile memory (for example, a one time programmable ROM (OTPROM), a PROM, an EPROM, an EEPROM, a mask ROM, a flash ROM, a flash memory, a hard disc drive, or a solid state drive (SSD)). The external memory 234 may include a flash drive, for example, a compact flash (CF), a secure digital (SD), a micro-SD, a mini-SD, an eXtreme digital (xD), a multi-media card (MMC), or a memory stick. The external memory 234 may be functionally and/or physically connected to the electronic device 201 through various interfaces.

The sensor module 240 may, for example, measure a physical quantity or detect the operating state of the electronic device 201 and convert the measured or detected information into an electrical signal. The sensor module 240 may include, for example, at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (for example, a red, green, blue (RGB) sensor), a biometric sensor 240I, a temperature/humidity sensor 240J, an illumination sensor 240K, or a ultraviolet (UV) sensor 240M. Additionally or alternatively, the sensor module 240 may include, for example, an e-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling one or more sensors included therein. In some embodiments, the electronic device 201 may further include a processor configured to control the sensor module 240 as a part of or separately from the processor 210, and may control the sensor module 240 while the processor 210 is in a sleep state.

The input device 250 may include, for example, a touch panel 252, a (digital) pen sensor 254, a key 256, or an ultrasonic input device 258. The touch panel 252 may employ, for example, at least one of a capacitive scheme, a resistive scheme, an infrared scheme, and an ultrasonic scheme. Furthermore, the touch panel 252 may further include a control circuit. The touch panel 252 may further include a tactile layer to provide a tactile reaction to a user. The (digital) pen sensor 254 may include, for example, a recognition sheet that is a part of, or separate from, the touch panel. The key 256 may include, for example, a physical button, an optical key, or a keypad. The ultrasonic input device 258 may detect ultrasonic waves, which are generated by an input tool, through a microphone (for example, a microphone 288) to identify data corresponding to the detected ultrasonic waves.

The display 260 (for example, the display 160) may include a panel 262, a hologram device 264, a projector 266, and/or a control circuit for controlling them. The panel 262 may be implemented to be, for example, flexible, transparent, or wearable. The panel 262, together with the touch panel 252, may be configured as one or more modules. According to an embodiment, the panel 262 may include a pressure sensor (or a POS sensor) which may measure a strength of pressure of a user's touch. The pressure sensor may be implemented integrally with the touch panel 252 or as one or more sensors separate from the touch panel 252. The hologram device 264 may show a three-dimensional image in the air by using an interference of light. The projector 266 may display an image by projecting light onto a screen. The screen may be located, for example, at the inside of outside of the electronic device 201. The interface 270 may include, for example, an HDMI 272, a USB 274, an optical interface 276, or a D-subminiature (D-sub) 278. The interface 270 may be included in, for example, the communication interface 170 illustrated in FIG. 1. Additionally or alternatively, the interface 270 may, for example, include a mobile high-definition link (MHL) interface, a secure digital (SD) card/multi-media card (MMC) interface, or an infrared data association (IrDA) standard interface.

The audio module 280 may convert, for example, sound into an electrical signal, and vice versa. At least some elements of the audio module 280 may be included, for example, in the input/output interface 145 illustrated in FIG. 1. The audio module 280 may process sound information that is input or output through, for example, a speaker 282, a receiver 284, an earphone 286, the microphone 288, and the like. The camera module 291 is a device that can photograph a still image and a moving image. According to an embodiment, the camera module 291 may include one or more image sensors (for example, a front sensor or a rear sensor), a lens, an image signal processor (ISP), or a flash (for example, an LED or xenon lamp). The power management module 295 may manage, for example, the power of the electronic device 201. According to an embodiment, the power management module 295 may include a power management integrated circuit (PMIC), a charger IC, or a battery or fuel gauge. The PMIC may use a wired and/or wireless charging method. Examples of the wireless charging method may include a magnetic resonance method, a magnetic induction method, an electromagnetic wave method, and the like. Additional circuits (for example, a coil loop, a resonance circuit, a rectifier, and the like) for wireless charging may be further included. The battery gauge may measure, for example, the residual amount of the battery 296 and a voltage, current, or temperature while charging. The battery 296 may include, for example, a rechargeable battery and/or a solar battery.

The indicator 297 may display a particular state, for example, a booting state, a message state, a charging state, or the like of the electronic device 201 or a part (for example, the processor 210) of the electronic device 201. The motor 298 may convert an electrical signal into a mechanical vibration and may generate a vibration, a haptic effect, or the like. The electronic device 201 may include a mobile TV support device that can process media data according to a standard, such as digital multimedia broadcasting (DMB), digital video broadcasting (DVB), mediaFlo™, and the like. Each of the above-described component elements of hardware according to the disclosure may include one or more elements, and the names of the corresponding elements may change based on the type of electronic device. In various embodiments, an electronic device (for example, the electronic device 201) may omit some elements or may further include additional elements, or some of the elements of the electronic device may be combined with each other to configure one entity, in which case the electronic device may identically perform the functions of the corresponding elements prior to the combination.

Figure 3:
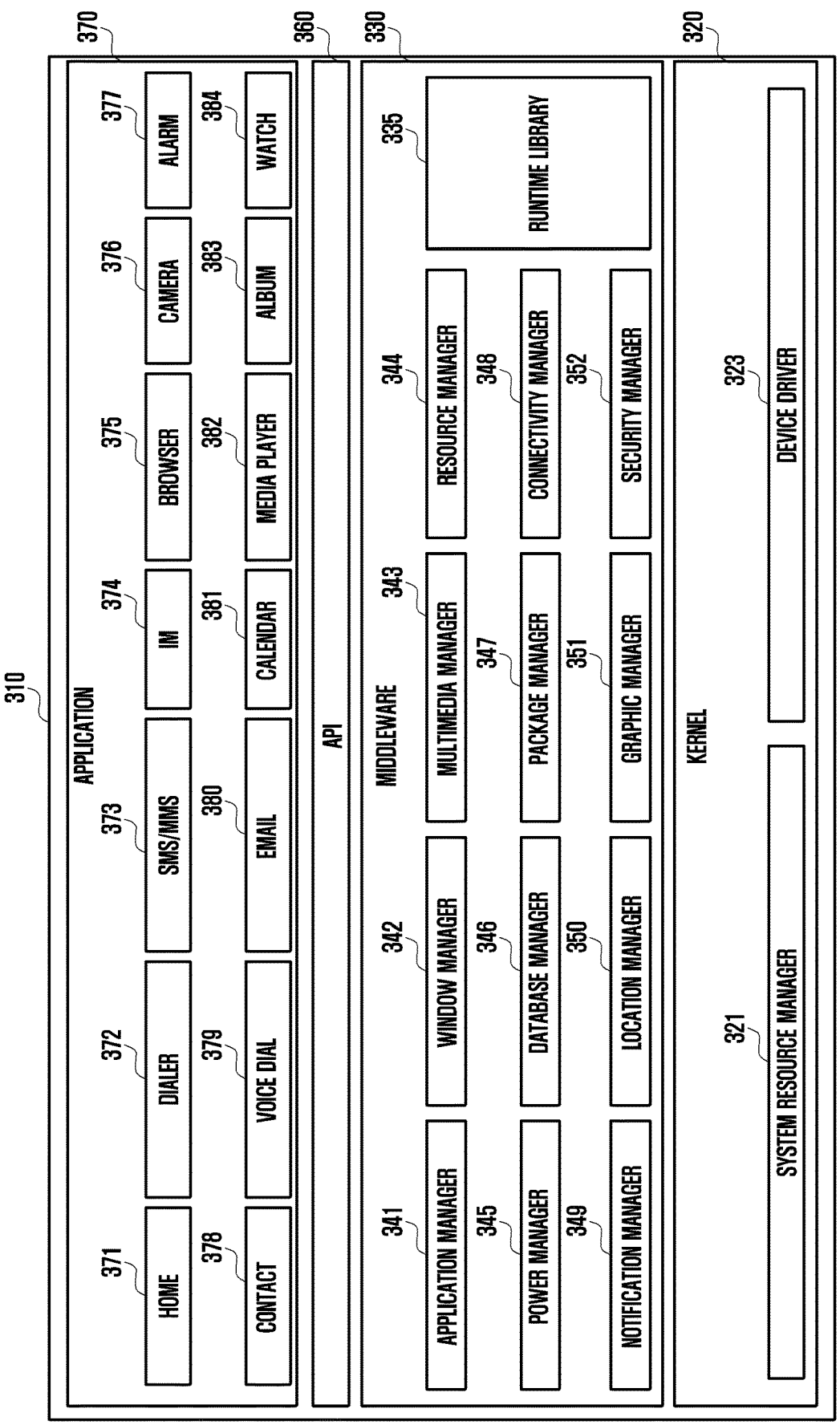
FIG. 3 is a block diagram of a program module according to various embodiments.

FIG. 3 is a block diagram of a program module according to various embodiments. According to an embodiment, the program module 310 (for example, the program 140) may include an operating system (OS) that controls resources relating to an electronic device (for example, the electronic device 101) and/or various applications (for example, the application programs 147) that are driven on the operating system. The operating system may include, for example, Android™, iOS™, Windows™, Symbian™, Tizen™, or Bada™. Referring to FIG. 3, the program module 310 may include a kernel 320 (for example, the kernel 141), middleware 330 (for example, the middleware 143), an API 360 (for example, the API 145), and/or applications 370 (for example, the application programs 147). At least a part of the program module 310 may be preloaded on the electronic device, or may be downloaded from an external electronic device (for example, the electronic device 102 or 104 or the server 106).

The kernel 320 may include, for example, a system resource manager 321 and/or a device driver 323. The system resource manager 321 may control, allocate, or retrieve system resources. According to an embodiment, the system resource manager 321 may include a process manager, a memory manager, or a file system manager. The device driver 323 may include, for example, a display driver, a camera driver, a Bluetooth driver, a shared memory driver, a USB driver, a keypad driver, a Wi-Fi driver, an audio driver, or an inter-process communication (IPC) driver. The middleware 330 may provide, for example, a function required by the applications 370 in common, or may provide various functions to the applications 370 through the API 360 such that the applications 370 can efficiently use limited system resources within the electronic device. According to an embodiment, the middleware 330 may include at least one of a runtime library 335, an application manager 341, a window manager 342, a multi-media manager 343, a resource manager 344, a power manager 345, a database manager 346, a package manager 347, a connectivity manager 348, a notification manager 349, a location manager 350, a graphic manager 351, and a security manager 352.

The runtime library 335 may include, for example, a library module that a compiler uses in order to add a new function through a programming language while the application 370 is being executed. The runtime library 335 may perform an input/output, manage a memory, or process an arithmetic function. The application manager 341 may manage, for example, the life cycle of the application 370. The window manager 342 may manage GUI resources used for a screen. The multimedia manager 343 may identify formats required for reproducing various media files and may encode or decode a media file using a codec suitable for the corresponding format. The resource manager 344 may manage the source code of the application 370 or the space in memory. The power manager 345 may manage, for example, battery capacity, temperature, or power, and may determine or provide power information required for the operation of the electronic device based on corresponding information. According to an embodiment, the power manager 345 may operate in conjunction with a basic input/output system (BIOS). The database manager 346 may, for example, generate, search, or change databases to be used by the application 370. The package manager 347 may manage the installation or update of an application that is distributed in the form of a package file.

The connectivity manager 348 may manage, for example, a wireless connection. The notification manager 349 may provide information on an event (for example, an arrival message, an appointment, a proximity notification, or the like) to a user. The location manager 350 may manage, for example, the location information of the electronic device. The graphic manager 351 may manage a graphic effect to be provided to a user and a user interface relating to the graphic effect. The security manager 352 may provide, for example, system security or user authentication. According to an embodiment, the middleware 330 may include a telephony manager for managing a voice or video call function of the electronic device or a middleware module that is capable of forming a combination of the functions of the above-described elements. According to an embodiment, the middleware 330 may provide specialized modules according to the types of operation systems. Furthermore, the middleware 330 may dynamically remove some of the existing elements, or may add new elements. The API 360 is, for example, a set of API programming functions, and may be provided while having different configurations depending on the operating system. For example, in the case of Android or iOS, one API set may be provided for each platform, and in the case of Tizen, two or more API sets may be provided for each platform.

The application 370 may include, for example, a home 371, dialer 372, short message service (SMS)/multimedia messaging service (MMS) 373, instant message (IM) 374, browser 375, camera 376, alarm 377, contact 378, voice dial 379, email 380, calendar 381, media player 382, album 383, watch 384, health care (e.g., for measuring the degree of workout or biometric information, such as blood sugar), or environmental information (e.g., for measuring air pressure, humidity, or temperature information) application. According to an embodiment, the applications 370 may include an information exchange application that can support the exchange of information between the electronic device and an external electronic device. The information exchange application may include, for example, a notification relay application for relaying particular information to an external electronic device or a device management application for managing an external electronic device. For example, the notification relay application may relay notification information generated in the other applications of the electronic device to an external electronic device, or may receive notification information from an external electronic device to provide the received notification information to a user. The device management application may perform turn-on or turn-off of the function of an external electronic device communicating with the electronic device (e.g. the external electronic device itself or some elements thereof) or adjust the brightness of (or resolution) of a display thereof, or may install, delete, or update an application running on the external electronic device. According to an embodiment, the application 370 may include applications (for example, a health care application of a mobile medical appliance) that are designated according to the attributes of an external electronic device. According to an embodiment, the application 370 may include applications received from an external electronic device. At least a part of the program module 310 may be implemented (for example, executed) by software, firmware, hardware (for example, the processor 210), or a combination of two or more thereof and may include a module, a program, a routine, an instruction set, or a process for performing one or more functions.

The term "module" as used herein may include a unit including hardware, software, or firmware, and may, for example, be used interchangeably with the term "logic", "logical block", "component", "circuit", or the like. The "module" may be an integrated element, or a minimum unit for performing one or more functions or a part thereof. The "module" may be mechanically or electronically implemented and may include, for example, an application-specific integrated circuit (ASIC) chip, a field-programmable gate arrays (FPGA), or a programmable-logic device, which has been known or are to be developed in the future, for performing certain operations. At least some of devices (e.g., modules or functions thereof) or methods (e.g., operations) according to various embodiments may be implemented by an instruction which is stored a computer-readable storage medium (e.g., the memory 130) in the form of a program module. The instruction, when executed by a processor (e.g., the processor 120), may cause the one or more processors to execute the function corresponding to the instruction. The computer-readable storage medium may include a hard disk, a floppy disk, a magnetic medium (e.g., a magnetic tape), an optical media (e.g., CD-ROM, DVD), a magneto-optical media (e.g., a floptical disk), an inner memory, etc. The instruction may include a code made by a complier or a code that can be executed by an interpreter. The programming module according to the disclosure may include one or more of the aforementioned components or may further include other additional components, or some of the aforementioned components may be omitted. Operations performed by a module, a programming module, or other elements according to various embodiments may be executed sequentially, in parallel, repeatedly, or in a heuristic manner. At least some operations may be executed according to another sequence, may be omitted, or may further include other operations.

An electronic device according to various embodiments of the disclosure may include: at least one sensor; a housing; a battery disposed in the housing and including a barometer sensor; and a processor, wherein the processor is configured to sense the internal atmospheric pressure inside the battery by using the barometer sensor, obtain status information related to the electronic device by using the at least one sensor, determine at least in part on the basis of the status information that the internal atmospheric pressure has satisfied a specified condition, and perform a predetermined function at least in part on the basis of the determination. The at least one sensor may include another barometer sensor configured to sense the external atmospheric pressure outside the electronic device, and the processor may be configured to obtain, as at least part of the status information, the external atmospheric pressure sensed by using the another barometer sensor. The processor may be configured to determine that the specified condition has been satisfied when the internal atmospheric pressure is higher than the external atmospheric pressure. The at least one sensor may include a humidity sensor configured to sense the humidity outside the electronic device, and the processor may be configured to obtain, as at least part of the status information, the external humidity sensed by using the humidity sensor. The at least one sensor may include a temperature sensor configured to sense the temperature of the electronic device, and the processor may be configured to obtain, as at least part of the status information, the temperature sensed by using the temperature sensor. As at least part of the performing operation of the predetermined function, the processor may be configured to adjust at least one characteristic related to charging of the battery. The electronic device may further include a display, and as at least part of the performing operation of the predetermined function, the processor may be configured to provide a notification related to a state of the battery through the display. The processor may be configured to obtain the internal atmospheric pressure sensed at specified time intervals by using the barometer sensor, and perform the predetermined operation primarily on the basis of changes in the internal atmospheric pressure sensed at the specified time intervals. The electronic device may further include a memory configured to store an initial value of the internal atmospheric pressure, and the processor may be configured to determine that the internal atmospheric pressure has satisfied the specified condition when the difference between the initial value and the internal atmospheric pressure is within a predetermined range. As at least part of the determining operation, the processor may be configured to determine a swollen state of a battery cell included in the battery at least in part on the basis of the internal atmospheric pressure. As at least part of the performing operation, the processor may be configured to perform a first function as at least part of the predetermined function when the swollen state is a first state, and perform a second function as at least part of the predetermined function when the swollen state is a second state.

A battery according to various embodiments of the disclosure may include: a battery housing configured to receive a battery cell; a connector formed on the battery housing; a barometer sensor disposed in the battery housing and configured to sense the internal atmospheric pressure inside the battery housing; and a detection circuit, wherein the detection circuit is configured to determine a state of the battery cell at least in part on the basis of the internal atmospheric pressure, and deliver a signal, corresponding to the state of the battery cell, to the electronic device connected through the connector. The battery may further include a temperature sensor, and the detection circuit may be configured to perform the determining operation primarily on the basis of a temperature sensed by the temperature sensor. The battery may further include a memory configured to store an initial value of the internal atmospheric pressure, and the detection circuit may be configured to perform the determining operation primarily on the basis of the difference between the initial value and the internal atmospheric pressure. The barometer sensor may be configured to sense the internal atmospheric pressure at specified time intervals, and the detection circuit may be configured to perform the determining operation primarily on the basis of changes in the internal atmospheric pressure sensed at the specified time intervals. The detection circuit may be configured to determine a swollen state of the battery cell at least in part on the basis of the internal atmospheric pressure, such that the swollen state is at least part of the state. As at least part of the performing operation, the detection circuit may be configured to deliver, to the electronic device, a first signal as at least part of the signal when the swollen state is a first state, and deliver thereto a second signal as at least part of the signal when the swollen state is a second state.

Figure 4:
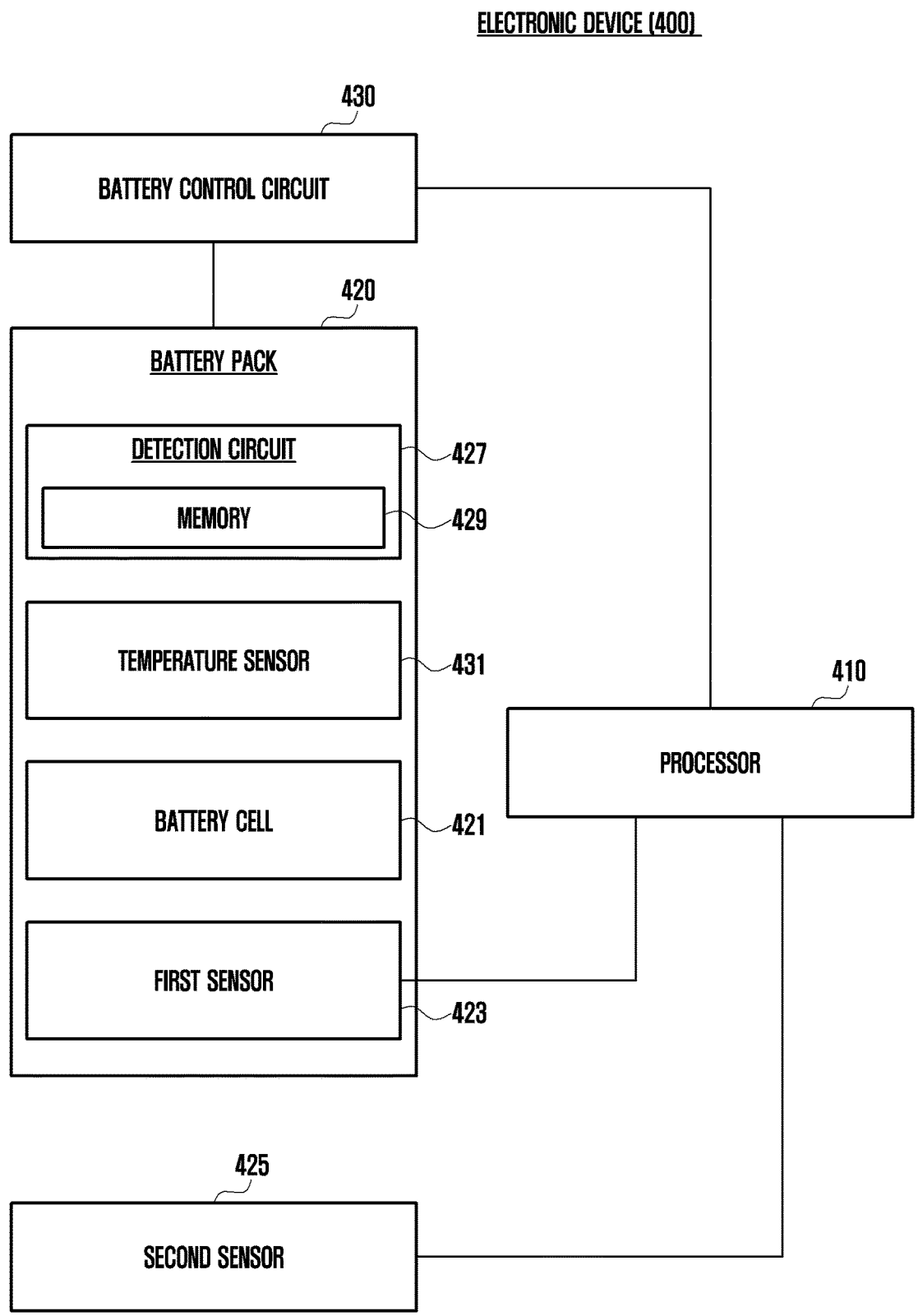
FIG. 4 is a block diagram illustrating the structure of an electronic device according to various embodiments of the disclosure.

FIG. 4 is a block diagram illustrating the structure of an electronic device according to various embodiments of the disclosure.

Referring to FIG. 4, an electronic device 400 (e.g. the electronic device 101) according to various embodiments of the disclosure may include a processor 410 (e.g. the processor 120), a battery pack 420 (e.g. the battery 296), or a battery control circuit 430 (e.g. the power management module 295).

According to an embodiment, the battery pack 420 may include at least one first sensor 423 configured to sense an internal state of the battery pack 420. For example, the first sensor 423 may include a barometer sensor configured to sense the atmospheric pressure inside the battery pack 420, or a contact sensor configured to sense whether a battery cell 421 is in contact with a housing (not illustrated) of the battery pack due to swelling of the battery cell 421. According to an embodiment, the electronic device 400 may include at least one sensor (e.g. the sensor module 240) configured to sense status information related to the electronic device 400. According to a particular embodiment, the electronic device 400 may further include another barometer sensor configured to measure the atmospheric pressure outside the electronic device 400. For example, the electronic device 400 may include a second sensor 425 (e.g. the barometer sensor 240C) configured to measure the atmospheric pressure outside the electronic device 400. According to a particular embodiment, the second sensor 425 may include a barometer sensor configured to measure the atmospheric pressure outside the electronic device 400, or a moisture sensor (e.g. the humidity sensor 240J) configured to sense moisture outside the electronic device 400.

Hereinafter, the atmospheric pressure inside the battery pack 420 is defined as a first atmospheric pressure and the atmospheric pressure outside the electronic device 400 (an atmospheric pressure corresponding to the outside of the battery pack 420) is defined as a second atmospheric pressure.

The processor 410 may include, for example, an application processor, a communication processor, etc. According to an embodiment, the processor 410 may operate an application and control constituent elements (e.g. the battery pack 420 and the battery control circuit 430) of the electronic device 400.

According to an embodiment, the processor 410 may measure an atmospheric pressure corresponding to the inside of the battery pack 420 by using the first sensor 423 and obtain (sense) status information related to the electronic device 400 by using the second sensor 425. According to an embodiment, the processor 410 may perform a predetermined function on the basis of an atmospheric pressure corresponding to the inside of the battery pack 420 and at least a piece of status information related to the electronic device 400. For example, the processor 410 may determine whether battery swelling has occurred or whether the battery pack 420 is damaged, on the basis of the atmospheric pressure corresponding to the inside of the battery pack 420 and the at least one piece of status information related to the electronic device 400. For example, the processor 410 may perform a predetermined function when it is determined that battery swelling has occurred or that the battery pack 420 has been damaged. According to an embodiment, the processor 410 may determine that a specified condition has been satisfied when the atmospheric pressure inside the battery pack 420 measured by the first sensor 423 is higher than the external atmospheric pressure measured by the second sensor 425. According to a particular embodiment, the processor 410 or a detection circuit of the battery pack 420 may sense the atmospheric pressure inside the battery pack 420 at specified time intervals and determine whether the specified condition is satisfied, primarily on the basis of changes in the internal atmospheric pressure sensed at the specified time intervals. According to an embodiment, the electronic device 400 may further include a memory configured to store an initial value of the atmospheric pressure inside the battery. For example, the memory may be included in the battery pack 420 or configured separately from the battery pack 420. In the description above, the initial value may be an atmospheric pressure inside a battery pack 420, measured when the battery pack 420 is identified as not being defective in a process of manufacturing and mass-producing the electronic device 400. According to a particular embodiment, the processor 410 or the detection circuit of the battery pack 420 may determine at least on the basis of the initial value whether the atmospheric pressure inside the battery pack 420 satisfies the specified condition.

In the description above, the predetermined function may include, for example, functions related to the battery pack 420. For example, the functions related to the battery pack 420 may include a function of controlling charging of the battery pack 420 by controlling the battery control circuit 430 (e.g. decreasing charging current or blocking charging), or a function of providing information on the battery pack 420 to a user by controlling a display (e.g. the display 160). According to an embodiment, as part of the predetermined function, the processor 410 may adjust at least one characteristic related to the charging when the electronic device 400 is in a state where the battery pack 420 thereof is being charged. According to a particular embodiment, as part of the predetermined function, the processor 410 may provide a notification related to a state of the battery pack 420 by means of the display 160.

According to an embodiment, the processor 410 may acquire the atmospheric pressure outside the electronic device 400 as at least part of the status information by using the second sensor 425. Otherwise the processor 410, for example, may acquire information on moisture (or humidity or temperature) outside the electronic device 400 as at least part of the status information by using the second sensor 425.

The battery pack 420 may include a battery cell 421 including a lithium ion battery, for example. According to an embodiment, the battery pack 420 may include a first sensor 423, which is a barometer sensor configured to sense the atmospheric pressure include the battery pack 420. The first sensor 423 may, for example, sense the pressure inside the battery pack 420 due to swelling of the battery cell 421 and convert the sensed pressure information into an electrical signal. According to an embodiment, the first sensor 423 may transmit a signal, relating to the pressure information inside the battery pack 420, to an external device, for example the battery control circuit 430 or the processor 410. A signal sensed by the first sensor 423 may be used, for example, by the processor 410 to determine whether battery swelling occurs.

According to one embodiment, in the battery pack 420, a detection circuit 427 may be included. The detection circuit according to various embodiments may include a control circuit that can perform a certain predetermined function (e.g. measuring an atmospheric pressure, comparing the measured atmospheric pressure with a reference atmospheric pressure, correcting the atmospheric pressure on the basis of temperature, or storing an atmospheric pressure history). For example, when a signal (e.g. an atmospheric pressure) sensed by the first sensor 423 satisfies a specified condition (e.g. when it is determined that swelling has occurred, on the basis of criteria, such as steady elevation in the atmospheric pressure, excess over the reference atmospheric pressure, etc.), the detection circuit 427 may transmit, to the processor 410, a signal notifying that the specified condition has been satisfied. Accordingly, the processor 410 may perform a predetermined function through the battery control circuit 430 without a separate operation of determining whether swelling has occurred.

According to an embodiment, the detection circuit 427 of the battery pack 420 may detect whether a specified condition has been satisfied (e.g. swelling of the battery cell), primarily on the basis of the temperature of the battery. The battery pack 420 according to various embodiments may further include a temperature sensor 431. The detection circuit 427 according to various embodiments may detect whether the specified condition has been satisfied, by measuring the temperature inside the battery by using the temperature sensor 431. For example, when the temperature inside the battery is high, the detection circuit 427 may at least transiently alter a criterion as to whether the specified condition is satisfied (e.g. an operation of raising a reference atmospheric pressure referred to determine whether the specified condition is satisfied).

According to an embodiment, the detection circuit 427 of the battery pack 420 may further include a memory 429. The memory 429 according to various embodiments may store a reference atmospheric pressure measured when the battery is manufactured. Accordingly, when an atmospheric pressure exceeding the reference atmospheric pressure by as much as a predetermined value range is measured, the detection circuit 427 may determine that the specified condition has been satisfied. According to another embodiment, the detection circuit 427 may store an atmospheric pressure history in the memory 429. For example, atmospheric pressures measured at specified time intervals during a predetermined time period may be transiently stored. The detection circuit 427 according to various embodiments may determine whether the battery cell 421 has swelled, on the basis of the stored atmospheric pressure history.

According to an embodiment, the processor 410 or the detection circuit of the battery pack 420 may determine a swelling degree of a battery cell 421 disposed in the battery pack 420, at least on the basis of the atmospheric pressure inside the battery pack 420. For example, the processor 410 or the detection circuit of the battery pack 420 may perform a first function as at least part of a predetermined function when the swollen state of the battery cell 421 is a first state, and may perform a second function as at least part of the predetermined function when the swollen state of the battery cell 421 is a second state. For example, the detection circuit of the battery pack 420 may transmit a first signal to the processor 410 as at least part of the first function and may transmit a second signal to the processor 410 as at least part of the second function. According to an embodiment, a swollen state of the battery cell 421 corresponding to the second state may be greater in size than a swollen state of the battery cell 421 corresponding to the first state. According to an embodiment, the processor 410 may gradationally perform functions relating to the charging of the battery pack 420 on the basis of a swollen state or swelling degree of the battery cell 421. For example, the processor 410 may determine swollen states of the battery cell 421 by classifying the swollen states according to a first stage to a third stage. For example, the processor 410 may adjust charging current supplied to the battery pack 420 when a swollen state of the battery cell 421 corresponds to the first stage. For example, the processor 410 may cut off charging current supplied to the battery pack 420 when a swollen state of the battery cell 421 corresponds to the second stage. For example, when a swollen state of the battery cell 421 corresponds to the third stage, the processor 410 may force a charge in the battery pack 420 to be discharged and may cut off charging current supplied to the battery pack 420.

The battery control circuit 430 may, for example, control the charging of the battery pack 420 under control of the processor 410. According to an embodiment, the battery control circuit 430 may include: a charging IC or a power management integrated circuit (PMIC) configured to manage the power of the electronic device 400. The PMIC may use, for example, a wired or a wireless charging mode. The wireless charging mode may include, for example, a magnetic resonance mode, a magnetic induction mode, an electromagnetic wave mode, or the like. According to an embodiment, the battery control circuit 430 may further include additional circuits for wireless charging, such as a coil loop, a resonance circuit, a rectifier, or the like. The battery control circuit 430 may measure, for example, the remaining capacity of the battery pack 420, the voltage, current, atmospheric pressure, or temperature during the charging and may transmit the measured information to the processor 410.

Figure 5:
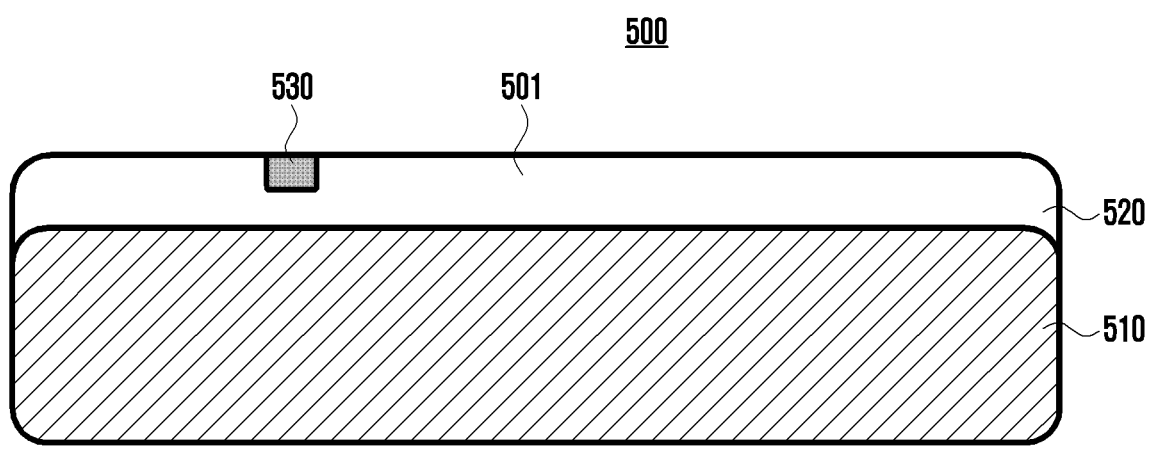
FIG. 5 is a cross-sectional view schematically illustrating the structure of a battery pack according to various embodiments of the disclosure.
Figure 6:
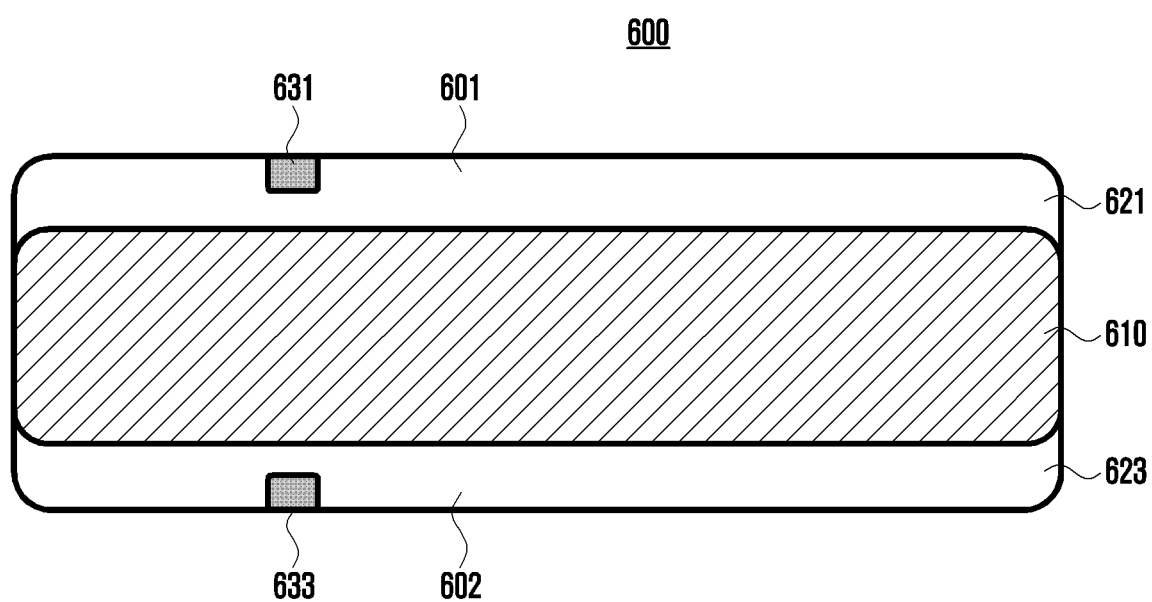
FIG. 6 is a cross-sectional view schematically illustrating the structure of a battery pack according to another embodiment of the disclosure.

FIG. 5 is a cross-sectional view schematically illustrating the structure of a battery pack according to various embodiments of the disclosure. FIG. 6 is a cross-sectional view schematically illustrating the structure of a battery pack according to another embodiment of the disclosure.

Referring to FIG. 5, a battery pack 500 according to various embodiments of the disclosure may include a battery cell 510 and a first sensor 530. The battery pack 500 according to various embodiments of the disclosure may be of a pouch type. According to an embodiment, the battery cell 510 may be designed to have the shape of a jelly-roll into which an electrode assembly is rolled contiguously from the central portion thereof. For example, the battery cell 510 according to various embodiments of the disclosure may have a structure or constituent element identical or similar with the battery disclosed in Korean Patent Application Publication No. 10-2005-0121512, Korean Patent Application Publication No. 10-2007-0006255, Korean Patent Application Publication No. 10-2006-0028177, or Korean Patent Application Publication No. 10-2006-0028184.

The first sensor 530 may be, for example, a barometer sensor configured to sense the atmospheric pressure inside the battery pack 500. According to an embodiment, the battery pack 500 may have a space 520 formed at at least one side of a battery cell 510 thereof, and at least one first sensor 530 may be positioned in the space 520. According to an embodiment, the space 520 may be filled with a fluid material. For example, the fluid material may be a gas or a liquid. For example, as a gas type fluid material, a normal air gas or a particular gas may be injected into the space 520. Otherwise, the space 520 may be filled with, as a liquid type fluid material, water or a liquid material containing particular particles, for example.

According to an embodiment, the first sensor 530 may sense the motion of the fluid material due to swelling or contraction of the battery cell 510, and a resultant atmospheric pressure change of the space 520. For example, the first sensor 530 may include a piezoresistivity sensor, the resistance value of which varies according to an atmospheric pressure change of the space 520. For example, when battery swelling occurs, the first sensor 530 may transmit a voltage value according to the changed resistance value to a battery control circuit or a processor.

According to an embodiment, the space 520 and the first sensor 530 may be positioned on a surface largest in area among the external surfaces of the battery cell 510. The swelling of the battery cell 510 may occur in the direction perpendicular to a surface largest in area among the external surfaces (in the longitudinal direction in FIG. 5). For the battery pack 500 according to various embodiments of the disclosure, it may be easy to sense the swelling of the battery cell 510 since the space 520 and the first sensor 530 are positioned on a surface largest in area among the external surfaces of the battery cell 510.

Referring to FIG. 6, differently from the embodiment illustrated in FIG. 5, a battery pack 600 according to another embodiment of the disclosure may have the spaces and the first sensors 631 and 633 positioned on one surface largest in area among the external surfaces of the battery cell 610 and on the other surface opposite the one surface. For example, a first sensor 631 and a space 621 may be formed on one surface of the battery cell 610, and another first sensor 631, 633 and another space 623 may be formed on the other surface of the battery cell 610 and opposite the one surface. According to a particular embodiment, the space 621 positioned on the one surface of the battery cell 610 and the space 623 positioned on the other surface of the battery cell 610 may be independent of each other. Otherwise, the first sensor 631 positioned on the one surface of the battery cell 610 and the first sensor 633 positioned on the other surface of the battery cell 610 may be operated independently of each other. For example, the first sensor 631 positioned on the one surface of the battery cell 610 may measure a first atmospheric pressure inside the battery pack 600, corresponding to the one surface of the battery cell 610, and the first sensor 633 positioned on the other surface of the battery cell 610 may measure a first atmospheric pressure inside the battery pack 600, corresponding to the other surface of the battery cell 610.

Figure 7:
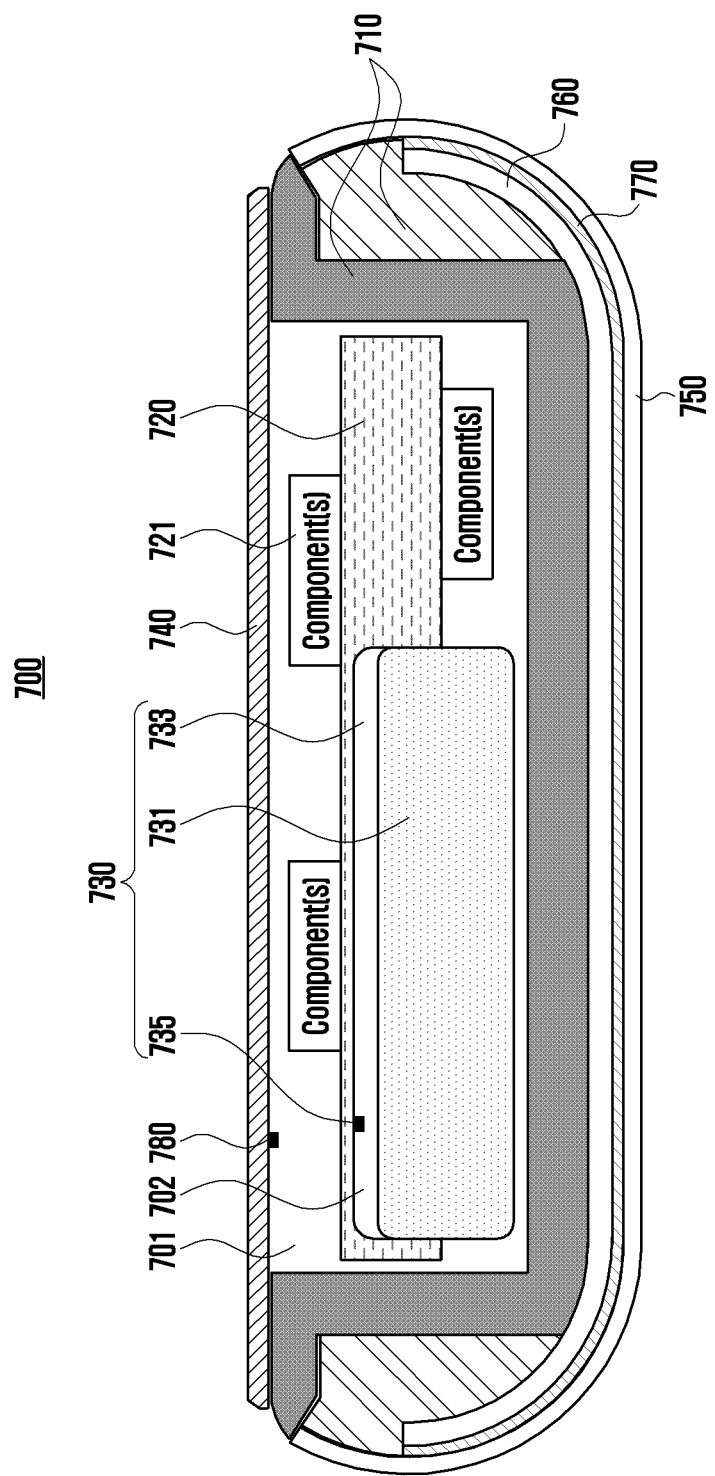
FIG. 7 is a cross-sectional view schematically illustrating an electronic device according to various embodiments of the disclosure.

FIG. 7 is a cross-sectional view schematically illustrating an electronic device according to various embodiments of the disclosure.

Referring to FIG. 7, an electronic device 700 (e.g. the electronic device 101 or the electronic device 400) according to various embodiments of the disclosure may include a housing 710, a PCB 720, a battery pack 730, a rear side casing 740, a front side glass piece 750, a display 760, or a touch screen 770.

The housing 710 may be configured, for example, to house the constituent elements of the electronic device 700 and support at least one constituent element. For example, the housing 710 may be coupled to the rear side casing to house the PCB 720, a battery, etc. For example, the housing 710 may be coupled to the front side glass piece 750 to support the display 760 or the touch screen 770.

On the PCB 720, for example, one or more components 721 configured to operate the electronic device 700 may be mounted. According to an embodiment, the battery pack 730 may be coupled to at least a portion of the PCB 720. According to an embodiment, a battery connector (not illustrated) to be connected to the battery pack 730 may be formed on the PCB 720. On the battery connector, signal lines may be formed, for example a signal line (not illustrated) for communication between the battery pack 730 and a battery control circuit (e.g. the power management module 295 or a processor (e.g. the processor 410)), or a signal line for communication between at least one sensor arranged in the battery pack 730 and the battery control circuit (or a processor (e.g. the processor 410)). The communication may be inter-integrated circuit ($I^2C$) communication, for example.

The battery pack 730 may be identical or similar with, for example, the battery pack 500 or 600 illustrated in FIGS. 5 and 6. For example, the battery pack 730 may include a battery cell 731, at least one space 733 formed on at least one surface of the battery cell 731, and at least one first sensor 735 (e.g. the first sensor 423) positioned in the at least one space 733. The at least one first sensor 735 may be, for example, a barometer sensor configured to sense the atmospheric pressure inside the battery pack 730.

The rear side casing 740 may be coupled to the housing 710, for example, at the rear side of the electronic device 700. According to an embodiment, at least one second sensor 780 (e.g. the second sensor 425) may be mounted on a portion of the rear side casing 740. According to a particular embodiment, the at least one second sensor 780 may be also mounted on the PCB 720. According to an embodiment, the at least one second sensor 780 may be a barometer sensor configured to measure the atmospheric pressure outside the electronic device 700. According to a particular embodiment, the at least one second sensor 780 may include a moisture sensor configured to sense moisture outside the electronic device 700. The moisture sensor may be used, for example, by a processor to determine whether the electronic device is placed in an underwater environment. In the present document, although the second sensor is to measure the atmospheric pressure, temperature, or humidity outside the electronic device, the second sensor may be physically positioned inside the electronic device and positioned outside the battery pack. In the present document, although the second sensor is positioned inside the electronic device, information measured by the second sensor is defined as at least part of status information relating to the outside of the electronic device. For example, in the present document, the descriptions as follows are used interchangeably; (i) the atmospheric pressure (or temperature or humidity) outside the electronic device, measured by the second sensor, (ii) the atmospheric pressure (or temperature or humidity) outside the battery pack, (iii) the atmospheric pressure (or temperature or humidity) inside the electronic device, or the like, but all the interchangeable descriptions above are defined as at least part of status information relating to the outside of the electronic device.

According to an embodiment, the electronic device 700 may have at least one processor (not illustrated) (e.g. the processor 410) mounted on the PCB 720, the processor being electrically (or functionally) connected to one or more components 721 configured to operate the electronic device 700. According to an embodiment, the processor may be functionally connected to the at least one first sensor 735 and the at least one second sensor 780. The processor may, for example, measure an atmospheric pressure corresponding to the inside of the battery pack 730 by using the first sensor 735 and obtain (sense) status information related to the electronic device 700 by using the second sensor 780. For example, the processor may perform a predetermined function on the basis of a first atmospheric pressure 702 corresponding to the inside of the battery pack 730 and at least one piece of status information related to the electronic device 700, for example a second atmospheric pressure 701 corresponding to the outside of the battery pack 730.

A method for operating an electronic device including a battery according to various embodiments of the disclosure may include the operations of: sensing the atmospheric pressure inside the battery by using a barometer sensor included in the battery; obtaining status information related to the electronic device by using at least one sensor of the electronic device; determining that the internal atmospheric pressure satisfies a specified condition, at least in part on the basis of the status information by using the processor of the electronic device; and performing a predetermined function at least in part on the basis of the determination by using the processor. The at least one sensor may include another barometer sensor configured to sense the atmospheric pressure outside the electronic device, and the obtaining operation may include an operation of obtaining, as at least part of the status information, the external atmospheric pressure sensed by using the another barometer sensor. The operation of determining may include an operation of determining that the specified condition has been satisfied when the internal atmospheric pressure is higher than the external atmospheric pressure.

Figure 8:
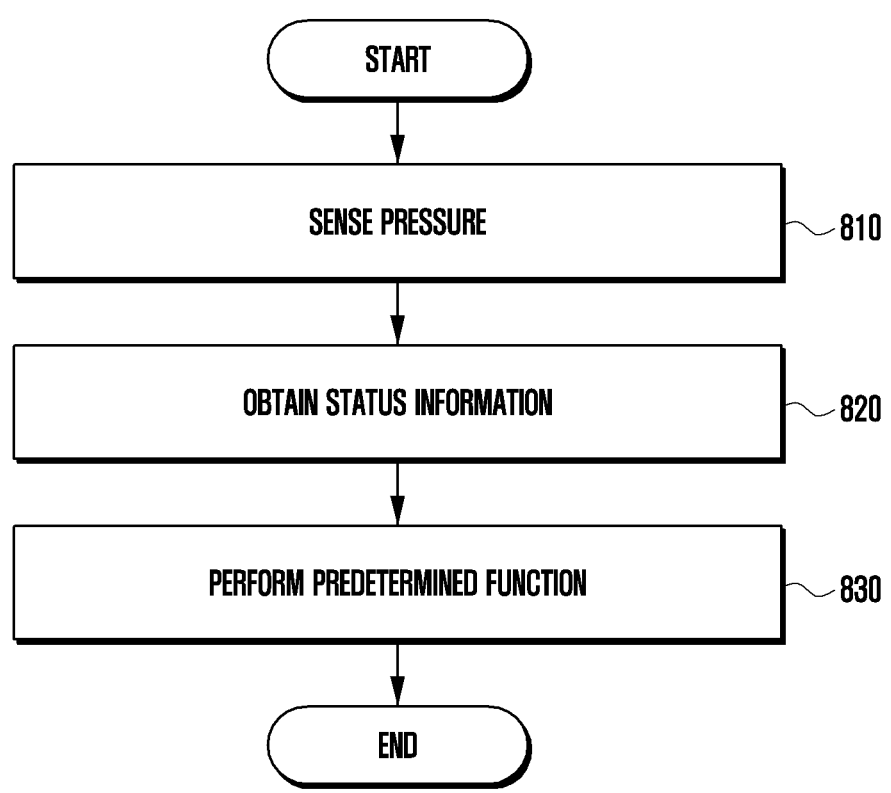
FIG. 8 is a flow chart illustrating the operation of an electronic device according to various embodiments of the disclosure.

FIG. 8 is a flow chart illustrating the operation of an electronic device according to various embodiments of the disclosure.

In operation 810, a processor (e.g. the processor 410) of an electronic device (e.g. the electronic device 400) may sense pressure relating to a battery pack (e.g. the battery pack 420). For example, the processor 410 may sense the pressure inside the battery pack 420 through a first sensor positioned inside the battery pack 420. According to a particular embodiment, a detection circuit positioned in the battery pack 420 may perform a certain predetermined function related to the battery pack 420 (e.g. measuring an atmospheric pressure, comparing the measured atmospheric pressure with a reference atmospheric pressure, correcting the atmospheric pressure on the basis of temperature, or storing an atmospheric pressure history). The detection circuit may, for example, acquire information relating to the battery pack 420 (e.g. the atmospheric pressure inside the battery pack 420 or swelling of a battery cell 421) by controlling at least one first sensor, convert the acquired information into an electrical signal, and deliver the electrical signal to the processor 410. The processor 410 may, for example, acquire the information relating to the battery pack 420 on the basis of the electrical signal received from the detection circuit.

In operation 820, the processor 410 of the electronic device 400 may sense status information relating to the electronic device 400 through a second sensor positioned outside the battery pack 420. The status information relating to the electronic device 400 may include, for example, the atmospheric pressure, temperature, or humidity outside the electronic device 400.

In operation 830, the processor 410 of the electronic device 400 may perform a predetermined function on the basis of at least one of the pressure relating to the battery pack 420 and the status information relating to the electronic device 400. In the description above, the predetermined function may include, for example, functions related to the battery pack 420. For example, the functions related to the battery pack 420 may include a function of controlling charging of the battery pack 420 by controlling the battery control circuit 430 (e.g. decreasing charging current or blocking charging), or a function of providing information on the battery pack 420 to a user by controlling a display (e.g. the display 160). According to an embodiment, as part of the predetermined function, the processor 410 may adjust at least one characteristic related to the charging when the electronic device 400 is in a state where the battery pack 420 thereof is being charged. According to a particular embodiment, as part of the predetermined function, the processor 410 may provide a notification related to a state of the battery pack 420 by means of the display 160.

Figure 9:
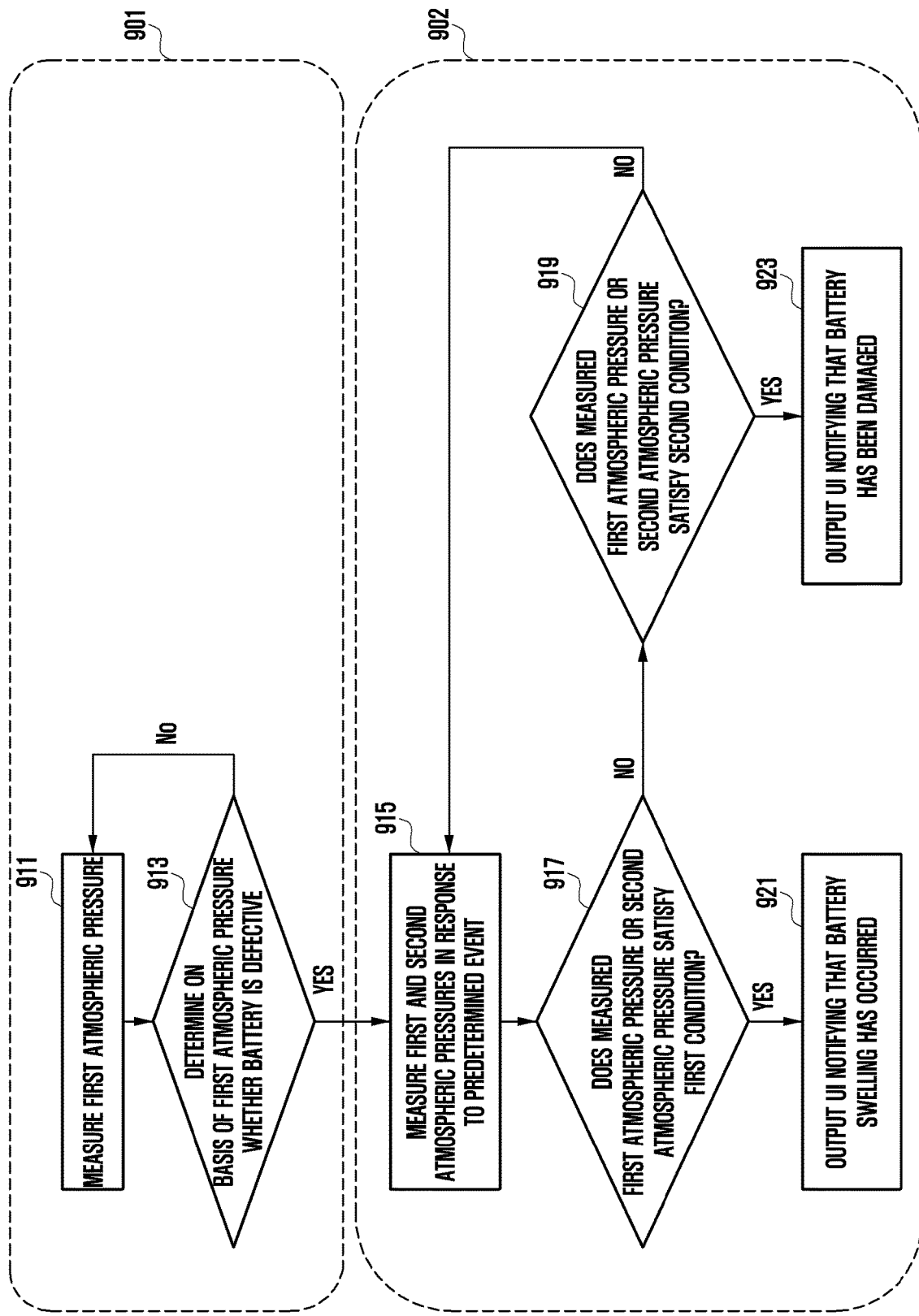
FIG. 9 is a flow chart illustrating the operation of an electronic device according to a particular embodiment of the disclosure.

FIG. 9 is a flow chart illustrating the operation of an electronic device according to a particular embodiment of the disclosure.

In FIG. 9, the operations referred to by reference sign 901 may fall into a flow chart according to which the operations are performed during a process of manufacturing an electronic device 800 (e.g. the electronic device 101 or the electronic device 400), and the operations referred to by reference sign 902 may fall into a flow chart for the operation of the electronic device 800 in a user environment after mass-production of the electronic device 800.

Process 901 of Manufacturing Electronic Device 800

In operation 911, a process of manufacturing an electronic device 800 according to a particular embodiment of the disclosure may include, for example, an operation of measuring a first atmospheric pressure 802 corresponding to the inside of a battery pack 830. For example, the operation of measuring the first atmospheric pressure 802 may be an operation of measuring the atmospheric pressure inside the battery pack 830 through at least one first sensor 835 positioned inside the battery pack 830.

In operation 913, the process of manufacturing the electronic device 800 according to a particular embodiment of the disclosure may, for example, determine whether the battery pack 830 is not defective, on the basis of the measured first atmospheric pressure 802 corresponding to the inside of the battery pack 830. According to an embodiment, when a battery pack 830 is identified as not being defective, the process of manufacturing the electronic device 800 may mass-produce the electronic device 800 including the corresponding battery pack 830, and a mass-produced electronic device 800 (e.g. the processor 120 or the detection circuit 427 of the battery) may perform operation 915. According to an embodiment, when the battery pack is identified as not being defective, the electronic device 800 may store the measured first atmospheric pressure 802 as a default value (or reference atmospheric pressure) in a memory (e.g. the memory 130 or the memory 429 included in the battery). For example, the first atmospheric pressure 802 measured during the manufacturing process may be used by the electronic device 800 to determine whether battery swelling or battery damage occurs, in a user environment after the mass-production of the electronic device 800. According to an embodiment, when a battery pack 830 is identified as being defective, the process of manufacturing the electronic device 800 can replace the corresponding battery pack 830 and then perform operation 911 again.

User Environment 902 after Mass-Production of Electronic Device 800

In operation 915, the electronic device 800 may, for example, measure a first atmospheric pressure 802 corresponding to the inside of the battery pack 830 in response to a predetermined event and measure a second atmospheric pressure 801 corresponding to the outside of the battery pack 830 as at least one piece of status information related to the electronic device 800. The predetermined event may be, for example, a battery charging event or a specified time interval.

In operation 917, the electronic device 800 may, for example, determine whether the measured first atmospheric pressure 802 or second atmospheric pressure 801 satisfies a predetermined first condition. According to an embodiment, when the first atmospheric pressure 802 or the second atmospheric pressure 801 satisfies the predetermined first condition, the electronic device 800 may perform operation 921. Otherwise, the electronic device 800 may, for example, perform operation 919 when the first atmospheric pressure 802 or the second atmospheric pressure 801 does not satisfy the predetermined first condition.

According to an embodiment, the first condition may be expressed as mathematical formula 1.

First atmospheric pressure 802 measured during manufacturing process×Pressure constant mapped to temperature around electronic device 800>Measured first atmospheric pressure 802  [Mathematical formula 1]

According to an embodiment, apart from measuring the first and second atmospheric pressures 802 and 801, the electronic device 800 may measure the current temperature around the electronic device 800 by using a temperature sensor. According to an embodiment, as expressed in mathematical formula 1, the electronic device 800 may compare a measured first atmospheric pressure 802 with the result obtained by the operation of multiplying a first atmospheric pressure 802 measured during a manufacturing process by a pressure constant corresponding to a current temperature. For example, when the result of the multiplication operation is greater than the first atmospheric pressure 802, the electronic device 800 may determine that the first condition has been satisfied. Otherwise, when the result of the multiplication operation is smaller than or equal to the measured first atmospheric pressure 802, the electronic device 800 may determine that the first condition is not satisfied.

In operation 921, for example, when the first condition has been satisfied, the electronic device 800 may determine that battery swelling has occurred. According to an embodiment, when the first condition has been satisfied, the electronic device 800 may provide (output), by means of a display, a user interface notifying that battery swelling has occurred. According to a particular embodiment, the electronic device 800 may determine battery swelling degrees according to the extent to which the result of the multiplication operation is greater than the measured first atmospheric pressure 802, and may discretely provide functions related to charging of the battery according to the battery swelling degrees. For example, when the difference between the result of the multiplication operation and the measured first atmospheric pressure 802 is relatively small, the electronic device 800 may determine that the swelling degree of the battery is relatively small, and restrict the maximum chargeable amount of the battery to about 80% or less. For example, when the difference between the result of the multiplication operation and the measured first atmospheric pressure 802 is relatively great, the electronic device 800 may determine that the swelling degree of the battery is relatively great, and restrict the maximum chargeable amount of the battery to about 30% or less. In the descriptions above, the numerical values of about 80% or about 30% to restrict the maximum chargeable amount are mere examples, and the disclosure is not limited thereto. According to a particular embodiment, the numerical values restricting the maximum chargeable amount may be determined according to multiple discrete ranges on the basis of the difference between the result of the multiplication operation and the measured first atmospheric pressure 802. A particular embodiment may include the operations of: limiting a charging function of the battery when the difference between the result of the multiplication operation and the measured first atmospheric pressure 802 exceeds a predetermined threshold; stopping charging the battery pack 420 when the battery pack 420 is being charged; forcing a charge in the battery to be discharged; or forcing the power of the electronic device 800 to be switched off.

In operation 919, the electronic device 800 may, for example, determine whether the measured first atmospheric pressure 802 or second atmospheric pressure 801 satisfies a predetermined second condition. According to an embodiment, when the first atmospheric pressure 802 or the second atmospheric pressure 801 satisfies the predetermined second condition, the electronic device 800 may perform operation 923. Otherwise, for example, when the first atmospheric pressure 802 or the second atmospheric pressure 801 does not satisfy all the predetermined first and second conditions, the electronic device 800 may perform operation 915 or an operation of detecting whether the predetermined event occurs.

According to an embodiment, the second condition may be expressed as mathematical formula 2.

Measured first atmospheric pressure 802=Measured second atmospheric pressure 801  [Mathematical formula 2]

According to an embodiment, as expressed in mathematical formula 2, the electronic device 800 may compare the measured first atmospheric pressure 802 and the measured second atmospheric pressure 801. For example, when the result of the comparison operation indicates that the measured first and second atmospheric pressures 802 and 802 are the same, the electronic device 800 may determine that the second condition has been satisfied.

In operation 923, for example, when the second condition has been satisfied, the electronic device 800 may determine that the battery pack 830 has been damaged. According to an embodiment, when the second condition has been satisfied, the electronic device 800 may output (provide), by means of the display, a user interface notifying that the battery pack 830 has been damaged.

Figure 10:
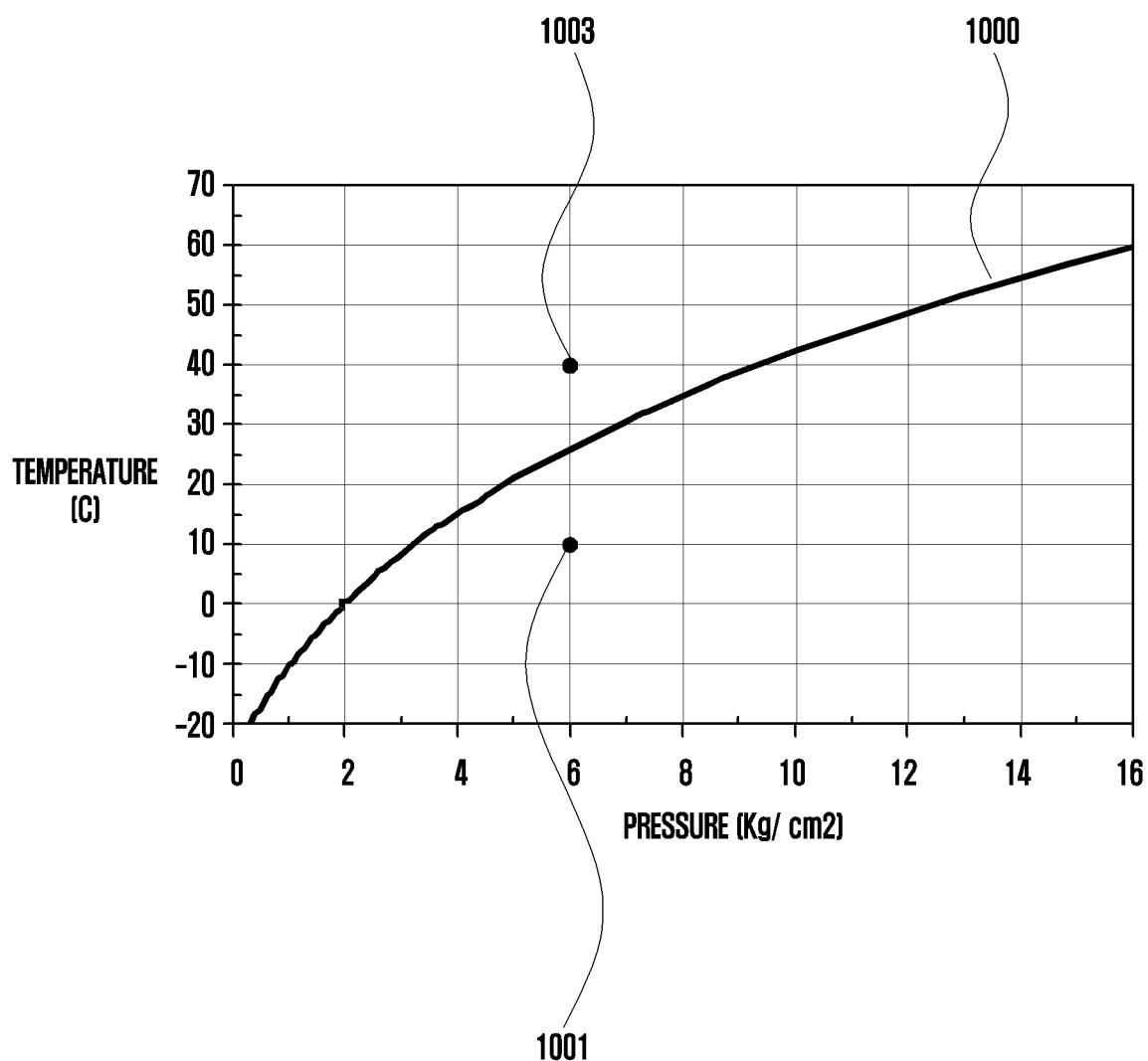
FIG. 10 is a graph representing changes of the pressure inside a battery pack according to changes of the temperature inside an electronic device.

FIG. 10 is a graph representing changes of the pressure inside a battery pack according to changes of the temperature inside the electronic device 800.

Referring to FIG. 10, the electronic device 800 according to various embodiments of the disclosure may apply a compensation algorithm for atmospheric pressure changes caused by the rise of the temperature inside the electronic device 800. For example, the electronic device 800 may apply the compensation algorithm by referring to a graph as plotted in FIG. 10 and a table corresponding thereto. For example, a curve 1000 plotted in FIG. 10 may represent thresholds obtained according to the correlation between a first atmospheric pressure 802, which is the atmospheric pressure inside the battery pack 830, and the rise of the temperature inside the electronic device 800.

According to an embodiment, the electronic device 800 may determine whether the battery pack 420 is normal (whether the battery pack has swelled), by referring to a graph as plotted in FIG. 10 and a table corresponding thereto. For example, when a temperature sensed by a temperature sensor (e.g. the temperature sensor 431) ranges between about 20-30° C., a processor (e.g. the processor 410) of the electronic device 800 may configure the threshold for a first atmospheric pressure 802, which is the atmospheric pressure inside the battery pack 830, as about 6 (Kg/cm$^2$) or less. For example, when a temperature sensed by the temperature sensor 431 ranges between about 20-30° C. and the first atmospheric pressure 802 exceeds about 6 (Kg/cm$^2$), the processor 410 may determine that swelling of the battery cell 421 has occurred.

For example, as illustrated in FIG. 10, when a temperature sensed by the temperature sensor 431 is about 40° C., a threshold for the first atmospheric pressure 802 may be about 9 (Kg/cm$^2$). Accordingly, as referred to by reference sign 1003, when a measured first atmospheric pressure 802 is 6 (Kg/cm$^2$) while a temperature sensed by the temperature sensor 431 is about 40° C., the processor 410 may determine that the battery cell 421 is in a normal state where no swelling occurs.

Otherwise, as illustrated in FIG. 10, when a temperature sensed by the temperature sensor 431 is about 10° C., a threshold for the first atmospheric pressure 802 may be about 2 (Kg/cm$^2$). Accordingly, as referred to by reference sign 1001, when a measured first atmospheric pressure 802 is 6 (Kg/cm$^2$) while a temperature sensed by the temperature sensor 431 is about 10° C., the processor 410 may determine that the battery cell 421 is in an abnormal state where swelling has occurred.

According to an embodiment, when it is determined that the battery cell 421 is in the abnormal state where swelling has occurred, the processor 410 of the electronic device 800 may provide, as at least part of the compensation algorithm, a function related to battery charging and a user notification function subsequent thereto, or a function related to the power of the electronic device 800 and a user notification function subsequent thereto.

Figure 11:
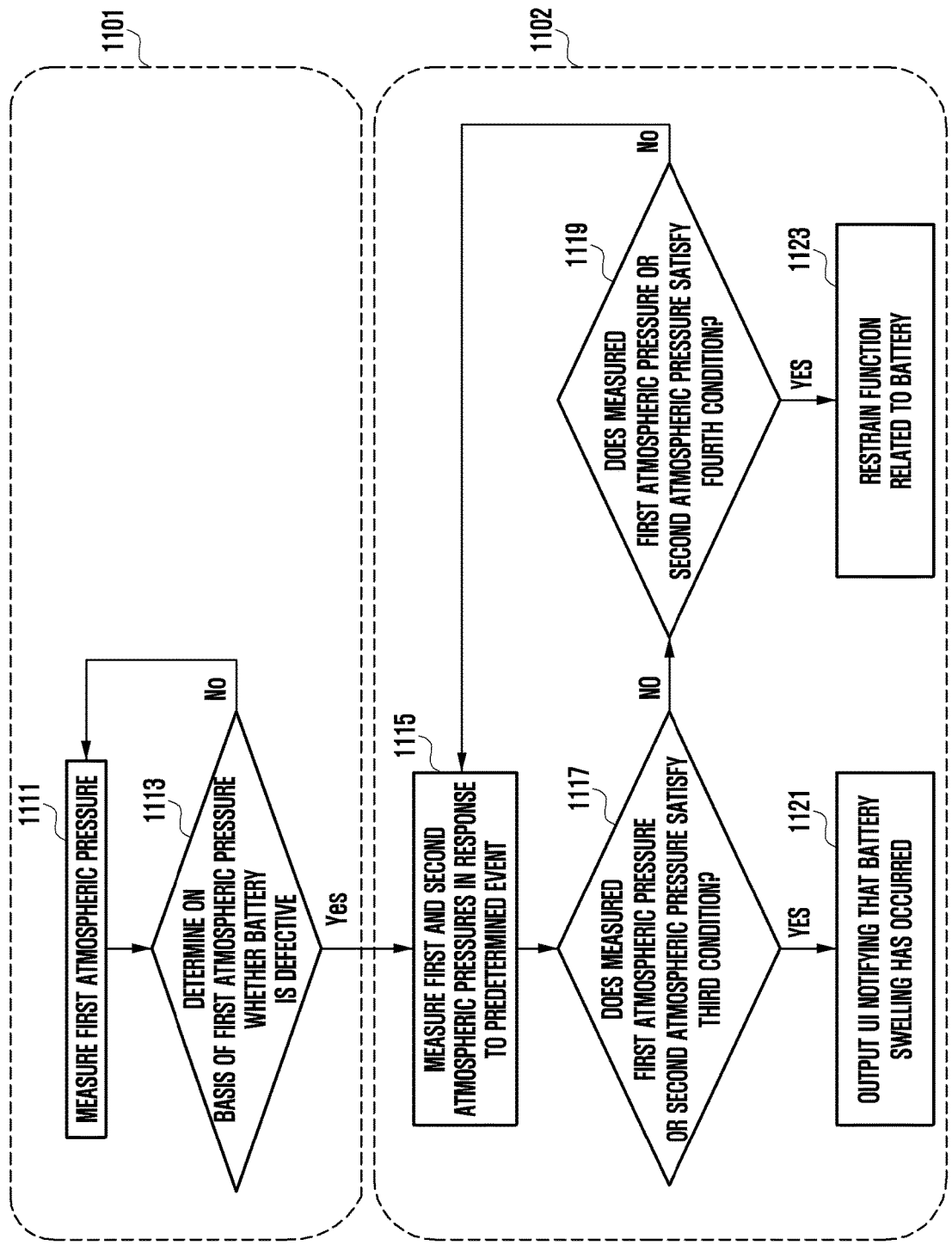
FIG. 11 is a flow chart illustrating the operation of an electronic device according to a particular embodiment of the disclosure.

FIG. 11 is a flow chart illustrating the operation of the electronic device 800 according to a particular embodiment of the disclosure.

In FIG. 11, the operations referred to by reference sign 1011 may fall into a flow chart according to which the operations are performed during a process of manufacturing the electronic device 800, and may be identical or similar with those referred to by reference sign 901 in FIG. 9. Otherwise, in FIG. 11, the operations referred to by reference sign 1102 may fall into a flow chart for the operation of the electronic device 800 in a user environment after mass-production of the electronic device 800 and may be identical or similar with the operations referred to by reference sign 902. In the description relating to FIG. 11, the same description as the operations in FIG. 9 may be omitted.

Process 1101 of Manufacturing Electronic Device 800

In operation 1111, a process of manufacturing the electronic device 800 according to various embodiments of the disclosure may include, for example, an operation of measuring a first atmospheric pressure 802 corresponding to the inside of the battery pack 830. For example, the operation of measuring the first atmospheric pressure 802 may be an operation of measuring the atmospheric pressure inside the battery pack 830 through at least one first sensor 835 positioned inside the battery pack 830.

In operation 1113, the process of manufacturing the electronic device 800 according to various embodiments of the disclosure may, for example, determine whether the battery pack 830 is not defective, on the basis of the measured first atmospheric pressure 802 corresponding to the inside of the battery pack 830. According to an embodiment, when a battery pack 830 is identified as not being defective, the process of manufacturing the electronic device 800 may mass-produce the electronic device 800 including the corresponding battery pack 830, and a mass-produced electronic device 800 may perform operation 1115. According to an embodiment, when the battery pack is identified as not being defective, the electronic device 800 may store the measured first atmospheric pressure 802 as a default value in a memory. For example, the first atmospheric pressure 802 measured during the manufacturing process may be used by the electronic device 800 to determine whether battery swelling or battery damage occurs, in a user environment after the mass-production of the electronic device 800. According to an embodiment, when a battery pack 830 is identified as being defective, the process of manufacturing the electronic device 800 can replace the corresponding battery pack 830 and then perform operation 1111 again.

User Environment 1102 after Mass-Production of Electronic Device 800

In operation 1115, the electronic device 800 may, for example, measure a first atmospheric pressure 802 corresponding to the inside of the battery pack 830 in response to a predetermined event and measure a second atmospheric pressure 801 corresponding to the outside of the battery pack 830 as at least one piece of status information related to the electronic device 800. The predetermined event may be, for example, a battery charging event.

In operation 1117, the electronic device 800 may, for example, determine whether the measured first atmospheric pressure 802 or second atmospheric pressure 801 satisfies a predetermined third condition. According to an embodiment, when the first atmospheric pressure 802 or the second atmospheric pressure 801 satisfies the predetermined third condition, the electronic device 800 may perform operation 1121. Otherwise, the electronic device 800 may, for example, perform operation 1119 when the first atmospheric pressure 802 or the second atmospheric pressure 801 does not satisfy the predetermined third condition.

According to an embodiment, the third condition may be expressed as mathematical formula 3.

Compensated first atmospheric pressure 802<Measured first atmospheric pressure 802 [Mathematical Formula 3]

According to an embodiment, as shown in table 1, the electronic device 800 may refer to the table which maps, onto "the compensated first atmospheric pressures 802", the results each obtained by the operation of multiplying a measured second atmospheric pressure 801 by an atmospheric pressure constant.

TABLE 1

| Measured second atmospheric pressure | Atmospheric pressure condition | IN compensation value | Measured first atmospheric pressure | Threshold |
|---|---|---|---|---|
| EX1 | 10 km underwater | EX1 × A | IN1 | |
| EX2 | 1 km underwater | EX2 × A | IN2 | |

TABLE 1-continued

| Measured second atmospheric pressure | Atmospheric pressure condition | IN compensation value | Measured first atmospheric pressure | Threshold |
|---|---|---|---|---|
| EX3 | 100 m underwater | EX3 × A | IN3 | |
| EX4 | 10 m underwater | EX4 × A | IN4 | TH_L |
| EX5 | Altitude of 0 m | EX5 × A | IN5 | |
| EX6 | Altitude of 10 m | EX6 × A | IN6 | |
| EX7 | Altitude of 100 m | EX7 × A | IN7 | |
| EX8 | Altitude of 1 km | EX8 × A | IN8 | TH_H |
| EX9 | Altitude of 10 km | EX9 × A | IN9 | |
| EX10 | Altitude of 100 km | EX10 × A | IN10 | |

For example, the electronic device 800 may refer to the table to compare the compensated first atmospheric pressure 802 and the measured first atmospheric pressure 802. For example, when a result of the comparison operation indicates that the measured first atmospheric pressure 802 is greater than the compensated first atmospheric pressures 802, the electronic device 800 may determine that the third condition has been satisfied. Otherwise, when the result of the comparison operation indicates that the measured first atmospheric pressure 802 is smaller than or equal to the compensated first atmospheric pressure 802, the electronic device 800 may determine that the third condition is not satisfied.

In operation 1121, for example, when the third condition has been satisfied, the electronic device 800 may determine that battery swelling has occurred. According to an embodiment, when the third condition has been satisfied, the electronic device 800 may output (provide), by means of a display, a user interface notifying that battery swelling has occurred. According to a particular embodiment, the electronic device 800 may determine battery swelling degrees according to the extent to which the measured first atmospheric pressure 802 is greater than the compensated first atmospheric pressure 802, and may discretely provide functions related to charging of the battery according to the battery swelling degrees. For example, when the result of the comparison operation indicates that the difference between the measured first atmospheric pressure 802 and the compensated first atmospheric pressure 802 is relatively small, the electronic device 800 may determine that the swelling degree of the battery is relatively small, and restrict the maximum chargeable amount of the battery to about 80% or less. For example, when the result of the comparison operation indicates that the difference between the measured first atmospheric pressure 802 and the compensated first atmospheric pressure 802 is relatively great, the electronic device 800 may determine that the swelling degree of the battery is relatively great, and restrict the maximum chargeable amount of the battery to about 30% or less. In the descriptions above, the numerical values of about 80% or about 30% to restrict the maximum chargeable amount are mere examples, and the disclosure is not limited thereto. A particular embodiment may include the operations of: limiting a charging function of the battery when the result of the comparison operation indicates that the difference between the measured first atmospheric pressure 802 and the compensated first atmospheric pressure 802 exceeds a predetermined threshold; forcing a charge in the battery to be discharged; or forcing the power of the electronic device 800 to be switched off.

In operation 1119, the electronic device 800 may, for example, determine whether the measured first atmospheric pressure 802 or second atmospheric pressure 801 satisfies a predetermined fourth condition. According to an embodiment, when the first atmospheric pressure 802 or the second atmospheric pressure 801 satisfies the predetermined fourth condition, the electronic device 800 may perform operation 1123. Otherwise, for example, when the first atmospheric pressure 802 or the second atmospheric pressure 801 does not satisfy all the predetermined first and fourth conditions, the electronic device 800 may perform operation 1115 or an operation of detecting whether the predetermined event occurs.

According to an embodiment, the fourth condition may be expressed as mathematical formula 4.

Measured second atmospheric pressure $801 < TH_L$,
(or) $TH_H <$ Measured second atmospheric pressure 801  [Mathematical formula 4]

According to an embodiment, as expressed in mathematical formula 4, when the measured second atmospheric pressure 801 is outside the range between the first threshold (TH_L) and the second threshold (TH_H), the electronic device 800 may determine that the fourth condition has been satisfied.

In operation 1123, for example, when the fourth condition has been satisfied, the electronic device 800 may determine that the electronic device 800 is under extreme conditions, such as a high-pressure underwater environment or a flight environment. According to an embodiment, when the fourth condition has been satisfied, the electronic device 800 may limit a function related to charging of the battery. For example, when the fourth condition has been satisfied, the electronic device 800 may restrict the maximum chargeable amount of the battery or force a charge in the battery to be discharged.

Figure 12:
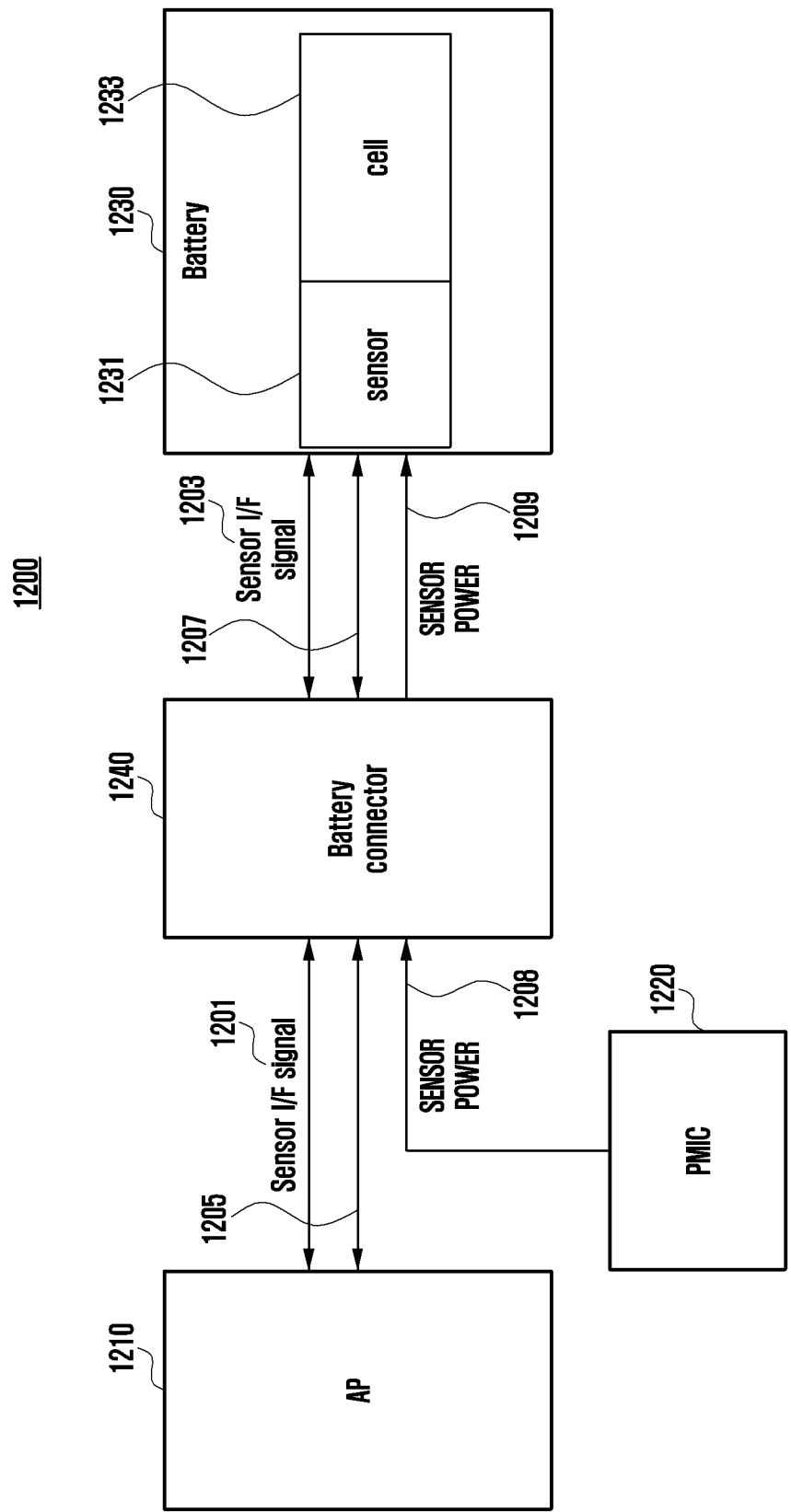
FIG. 12 is a block diagram illustrating connection lines for a battery and a processor of an electronic device according to various embodiments of the disclosure.

FIG. 12 is a block diagram illustrating connection lines for the battery and processor of an electronic device according to various embodiments of the disclosure.

Referring to FIG. 12, an electronic device 1200 (e.g. the electronic device 400) according to various embodiments of the disclosure may include an application processor (AP) (e.g. the processor 410), a battery 1230, a battery connector 1240, or a power management integrated circuit (PMIC) 1220.

The AP 1210 may be identical or similar with, for example, the processor 410 illustrated in FIG. 4. According to an embodiment, the AP 1210 may measure an atmospheric pressure corresponding to the inside of the battery 1230 by using a sensor 1231 disposed in the battery 1230 and obtain (sense) status information related to the electronic device 1200 by using the measured atmospheric pressure. According to an embodiment, the AP 1210 may perform a predetermined function on the basis of the status information related to the electronic device 1200. For example, the AP 1210 may determine whether battery swelling has occurred or whether the battery has been damaged, and accordingly perform a predetermined function.

The battery 1230 may be identical or similar with, for example, the battery pack 420 illustrated in FIG. 4. The battery 1230 may include at least one sensor 1231 configured to measure the atmospheric pressure inside a cell 1233 or the battery 1230, for example.

The battery connector 1240 may include, for example, a signal line for communication between the battery 1230 and the PMIC 1220 or AP 1210, a signal line for communication between the AP 1210 and the sensor 1231 in the battery 1230, a signal line for communication between the AP 1210 or PMIC 1220 and at least a battery control circuit formed in the battery 1230, or the like. The communication may be inter-integrated circuit ($I^2C$) communication, for example. For example, the communication may include a sensor interface 1201 and 1203 configured to transmit/receive a signal to/from the sensor 1231 of the battery 1230, a sensor power interface 1208 and 1209 configured to transmit/receive a signal related to power for the sensor 1231 of the battery 1230, a charging interface 1205 and 1207 configured to transmit/receive a signal related to charging of the cell 1233 of the battery 1230, or the like.

Figure 13:
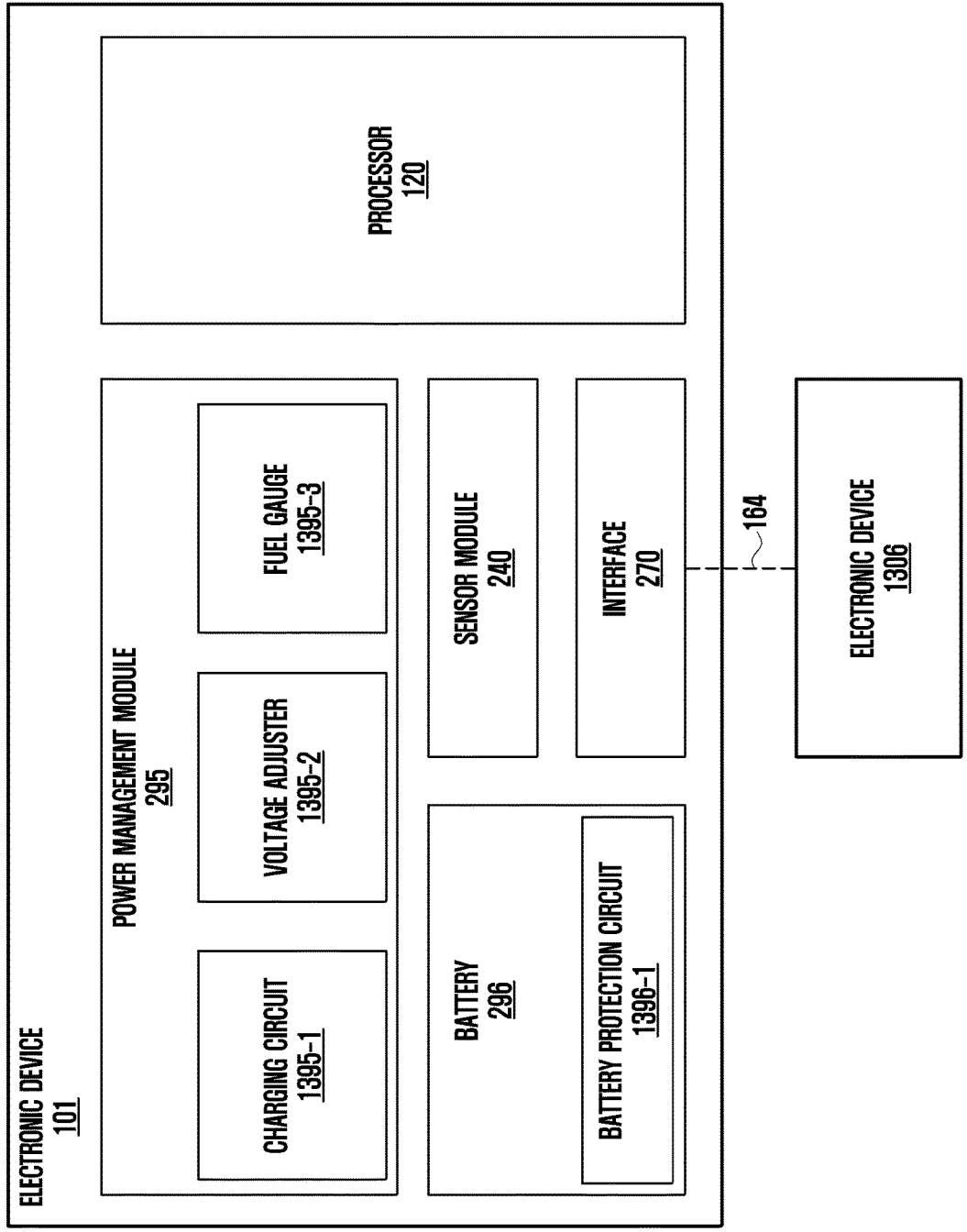
FIG. 13 is a block diagram illustrating a power management module and a battery of an electronic device according to various embodiments.

FIG. 13 is a block diagram illustrating the power management module 295 and the battery 296 of the electronic device 101 according to various embodiments.

Referring to FIG. 13, the power management module 295 according to an embodiment may include a charging circuit 1395-1, a voltage adjuster 1395-2, and a fuel gauge 1395-3. The power management module 295 may be designed without a certain constituent element (e.g. the fuel gauge 1395-3) or may further include another constituent element. According to an embodiment, the charging circuit 1395-1, the voltage adjuster 1395-2, or the fuel gauge 1395-3 may be formed as an independent module separately from the power management module 295.

The charging circuit 1395-1 may perform fast charging of the battery 296 at least in part on the basis of a type of external electronic device 1306 (e.g. a power adaptor or a USB drive) or electric energy (e.g. about 20 watts or more) that an external electronic device 1306 can supply.

The voltage adjuster 1395-2 may generate power at various voltage levels and provide the generated power to the constituent elements 110-196 included in the electronic device 101. According to an embodiment, the voltage adjuster 1395-2 may include a low-dropout (LDO) regulator or a switching regulator.

The fuel gauge 1395-3 may measure, for example, first state information (e.g. a battery capacity, the number of battery charging/discharging, a battery temperature, or a battery voltage) of the battery 296.

The power management module 295 may determine second state information (e.g. the lifespan, an overvoltage, a low voltage, an overcurrent, overcharging, overheating, a short circuit, or swelling) of the battery 296 at least in part on the basis of the first state information.

The processor 120 may control at least a certain portion of the functions of the power management module 295 or at least a certain portion of the sub-constituent elements thereof (e.g. the charging circuit 1395-1) at least in part on the basis of the second state information. According to an embodiment, the processor 120 may determine whether the battery 296 is in a normal state or an abnormal state, at least in part on the basis of the second state information. When it is determined that the battery 296 is in the abnormal state, the processor 120 may control an operation of charging the battery 296 performed by the charging circuit 1395-1 (e.g. decreasing charging current or voltage or stopping the charging).

According to an embodiment, the battery 296 may include a battery protection circuit (protection circuit module (PCM)) 1396-1 to slow down performance degradation of the battery 296. When, for example, an overvoltage, an overcurrent, overheating, an over discharge, or a short circuit is detected while the battery 296 is charging, the battery protection circuit 1396-1 may stop the charging. The battery 296 can be accordingly prevented from burning. According to an embodiment, the battery protection circuit 1396-1 may be included as at least part of a battery management system (BMS) configured to perform cell balancing, measure the battery capacity, count the number of battery charging/discharging, measure the battery temperature, or measure the battery voltage, apart from the function of preventing the battery 296 from burning.

The sensor module 240 may perform measurement for at least part of the state information of the battery 296 independently (e.g. substitutively or additionally) of the fuel gauge 1395-3. According to an embodiment, the sensor module 240 may be included as part of the battery protection circuit 1396-1, or formed as a separate module and disposed near the battery 296.

The interface 270 may receive data or power from an external electronic device 1306 (e.g. a power adaptor, a power charger, or an external battery) or provide data or power to an external electronic device 1306 (e.g. a portable communication device or a wearable device). According to an embodiment, the interface 270 may support a wired charging mode (e.g. a USB mode) or a wireless charging mode (e.g. a magnetic induction mode, a magnetic resonance mode, or an electromagnetic wave mode). According to an embodiment, additional circuits for wireless charging, such as a coil loop, a resonance circuit, a rectifier, or the like may be further included.

As described above, various embodiments of the disclosure can sense battery swelling in advance to prevent a safety accident due to the burning, explosion, etc. of a battery pack. Otherwise, various embodiments of the disclosure can sense swelling of a battery in advance and then limit a function related to charging of the battery beforehand, thereby requiring no heat shield which is to protect the components of an electronic device from heat generated from a battery pack, and thus it is possible to reduce the manufacturing costs.

Each of the above-described elements of hardware according to the disclosure may include one or more components, and the names of the elements may vary based on the type of electronic device. In various embodiments, the electronic device may include at least one of the above-described elements, and may exclude some of the elements or further include other additional elements. Further, some of the elements of the electronic device according to the various embodiments may be combined to form a single entity, and thus, may equivalently execute functions of the corresponding elements prior to the combination.

The invention claimed is:

1. An electronic device comprising:
a housing;
a battery disposed in the housing and comprising a first barometer sensor;
at least one sensor comprising a second barometer sensor; and
a processor,
wherein the processor is configured to:
  detect an internal atmospheric pressure inside the battery by using the first barometer sensor,
  detect an external atmospheric pressure outside the electronic device by using the second barometer sensor,
  determine whether a specified condition has been satisfied based on the internal atmospheric pressure and the external atmospheric pressure, and perform a specified function based on determining that the specified condition has been satisfied, wherein the processor is configured to determine that the specified condition has been satisfied when the internal atmospheric pressure is higher than the external atmospheric pressure.

2. The electronic device of claim 1, wherein the at least one sensor further comprises a humidity sensor configured to sense external humidity outside the electronic device, and the processor is configured to obtain, as at least part of status information, the external humidity sensed by the humidity sensor.

3. The electronic device of claim 1, wherein the at least one sensor further comprises a temperature sensor configured to sense temperature of the electronic device, and the processor is configured to obtain, as at least part of status information, the temperature sensed by the temperature sensor.

4. The electronic device of claim 1, wherein the processor is configured to adjust at least one characteristic related to charging of the battery, as at least part of the performing of the specified function.

5. The electronic device of claim 1, further comprising a display, wherein the processor is configured to provide a notification related to a state of the battery through the display, as at least part of the performing of the specified function.

6. The electronic device of claim 1, wherein the processor is configured to obtain the internal atmospheric pressure detected at a specified time interval by the first barometer sensor, and perform the specified function; based on a change in the internal atmospheric pressure detected at the specified time interval.

7. The electronic device of claim 1, further comprising a memory configured to store an initial value of the internal atmospheric pressure, wherein the processor is configured to determine that the internal atmospheric pressure has satisfied the specified condition when a difference between the initial value and the internal atmospheric pressure is within a specified range.

8. The electronic device of claim 1, wherein the processor is configured to determine a swollen state of a battery cell included in the battery, at least partly based on the internal atmospheric pressure.

9. The electronic device of claim 8, wherein the processor is configured to perform a first function as at least part of the specified function when the swollen state is a first state, and perform a second function as at least part of the specified function when the swollen state is a second state, as at least part of the performing.

10. A method for operating an electronic device comprising a battery, the method comprising:
    detecting an internal atmospheric pressure inside the battery by using a first barometer sensor included in the battery;
    detecting an external atmospheric pressure outside the electronic device by using a second barometer sensor,
    determining whether a specified condition has been satisfied based on the internal atmospheric pressure and the external atmospheric pressures; and
    performing a specified function based on determining that the specified condition has been satisfied,
    wherein the method further comprises determining that the specified condition has been satisfied when the internal atmospheric pressure is higher than the external atmospheric pressure.

11. The method of claim 10, wherein the performing of the specified function comprises adjusting at least one characteristic related to charging of the battery.

* * * * *